(12) United States Patent
Kubo et al.

(10) Patent No.: US 6,314,387 B1
(45) Date of Patent: Nov. 6, 2001

(54) METHOD OF SEQUENCE ESTIMATION

(75) Inventors: Hiroshi Kubo; Keishi Murakami, both of Tokyo (JP)

(73) Assignee: Mitsubishi Denki Kabushiki, Tokyo (JP)

( * ) Notice: Subject to any disclaimer, the term of this patent is extended or adjusted under 35 U.S.C. 154(b) by 0 days.

(21) Appl. No.: 09/171,531
(22) PCT Filed: Mar. 4, 1997
(86) PCT No.: PCT/JP97/00652
 § 371 Date: Oct. 21, 1998
 § 102(e) Date: Oct. 21, 1998
(87) PCT Pub. No.: WO98/39848
 PCT Pub. Date: Sep. 11, 1998
(51) Int. Cl.$^7$ ................................................ H01L 27/06
(52) U.S. Cl. ......................... 702/189; 375/341; 714/786
(58) Field of Search ........................ 702/189; 714/786, 714/787, 788, 794, 795; 375/341

(56) References Cited

U.S. PATENT DOCUMENTS

| 5,081,651 | 1/1992 | Kubo | ................... | 375/341 |
| 5,146,475 | 9/1992 | Kubo | ................... | 375/341 |
| 5,673,294 | * 9/1997 | Namekata | ........................ | 375/341 |

FOREIGN PATENT DOCUMENTS

| 05-227043 | 9/1993 | (JP) . |
| 52 27043A | 9/1993 | (JP) . |
| 06-284018 | 10/1994 | (JP) . |
| 62 84018A | 10/1994 | (JP) . |

OTHER PUBLICATIONS

H. Kubo, et al., "Characteristics of Adoptive Viterbi Decoder Using Estimation Method in Every State", The transaction of IEICE A Dec. 25, 1994, (Dec. 25, 1994), vol. J77–A, No. 12, pp. 1650–1660.

A. Duel–Hallen, et al., Delayed Decision–Feedback Sequence Estimation:, IEEE transactions on Communications, vol. 37, No. 5, May 5, 1989, pp. 428–436.

Eyuboglu et al, "Reduced–State Sequence with Set Partitioning and Decision Feedback", vol. 36, No. 1, Jan. 1988, pp. 13–20.

\* cited by examiner

Primary Examiner—Kamini Shah

(57) ABSTRACT

The prior art method of estimating a sequence by making use of a Viterbi algorithm is modified as follows: (1) A path at a certain past instant is modified to derive a modified path. (2) The path metric value of the modified path is calculated. (3) The path metric of a normal path and the path metric of the modified path are compared. If the path metric of the modified path is smaller, the path is modified. (4) A surviving path is selected from plural paths passing through the modified path.

9 Claims, 17 Drawing Sheets

<SURVIVING PATH AT K=4>

<K=5>

<SURVIVING PATH AT K=5>

NUMBER OF REPETITIONS (AVERAGE Eb/No=15dB)

FIG.14
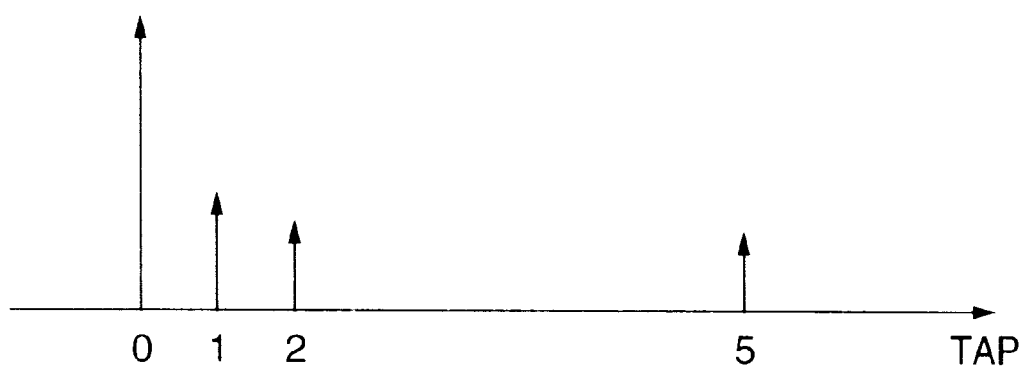
(a) MINIMUM PHASE CONDITION
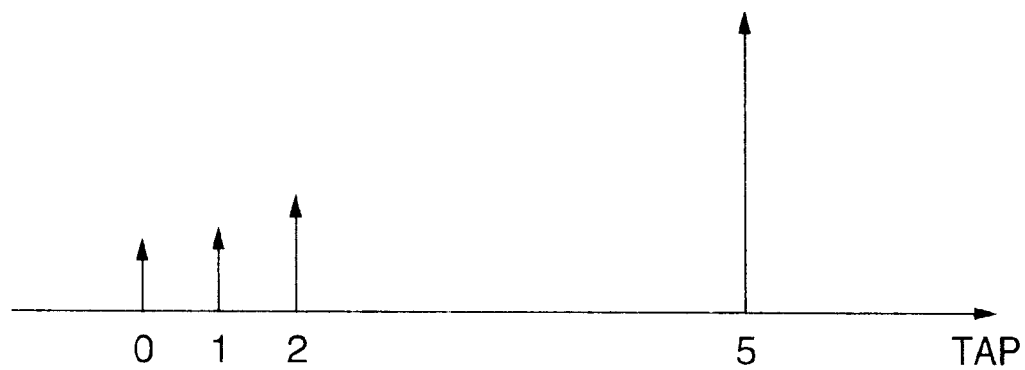
(b) NON-MINIMUM PHASE CONDITION

FIG.15
PRIOR ART
CANDIDATE FOR TRANSMITTED SEQUENCE
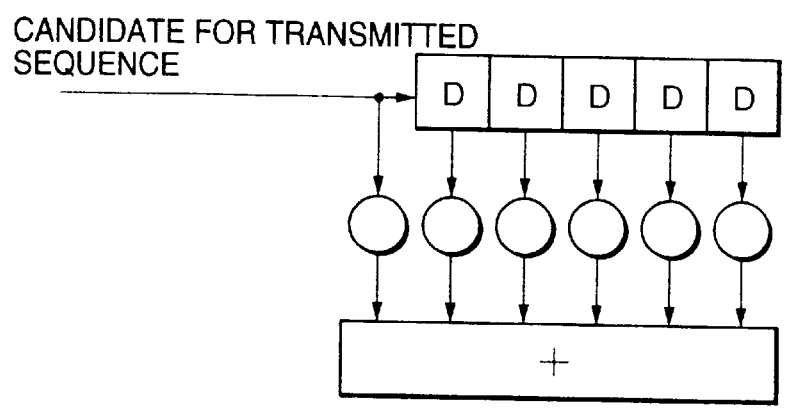
STATE AT INSTANT K 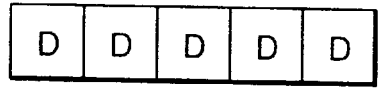 ⎫
STATE AT INSTANT (K-1)  ⎬ MLSE
STATE AT INSTANT K 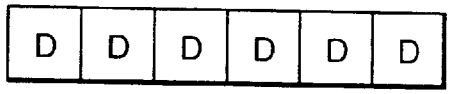 ⎭
STATE AT INSTANT K 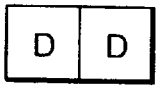 ⎫
                        SURVIVING PATHS
STATE AT INSTANT (K-1) 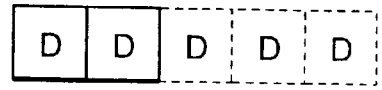 ⎬ DFSE
BRANCH AT INSTANT K 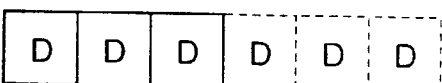 ⎭

METHOD OF SEQUENCE ESTIMATION

This application is the national phase under 35 U.S.C. §371 of prior PCT International Application No. PCT/JP97/00652 which has an International filing date of Mar. 4, 1997 which designated the United States of America, the entire contents of which are hereby incorporated by reference.

TECHNICAL FIELD

The present invention relates to transmission of digital data as conducted in mobile telephone service and, more particularly, to a method of estimating the sequence of a transmitted signal from a received signal and from the characteristics of the channel by the receiver.

BACKGROUND ART

The background art for the present invention is described.
Prior Art Technique 1

In digital data transmission, it is normally impossible for a receiver to receive a signal transmitted by a sender as it is due to the state of the channel and noises. The transmitted signal is converted into other form by the state of the channel and by noises. This converted form is received.

A model describing conversion of a signal on a channel is illustrated in FIG. 16. As shown in this figure, the signal is delayed on the channel. In addition, noises are adeed. Let $X_k$ be transmitted signal. The received signal $r_k$ is given by $$r_k = \sum_{i=0}^{L} c_i x_{k-i} + w_k \quad (1)$$

where L is the length of memory of the channel that delays the transmitted signal, $C_i$ is a tap coefficient, and $w_k$ is a noise sequence. The tap coefficient and the noise sequence are values determined by the characterstics of the channel.

The receiver receiving the signal $r_k$ estimates the transmitted signal from the received signal $r_k$ and from the tap coefficient $c_i$.

The receiver, or a sequence estimator, convolves a candidate for the transmitted signal with known tap coefficients and calculates an estimated value (hereinafter referred to as a replica) of the received signal as follows:

$$\hat{r}_k = \sum_{i=0}^{L} c_i \hat{x}_{k-i} \quad (2)$$

Furthermore, the receiver, or the sequence estimator, calculates the error power between the estimated value (replica) of the received signal calculated according to Eq. 2) and the actual received signal, using the following Eq. (3):

$$\sum_k |e_k|^2 = \sum_k |r_k - \hat{r}_k|^2 \quad (3)$$

The receiver searches for a transmitted signal candidate minimizing the error power given by Eq. (3) and estimates that this candidate is the transmitted signal.

Processing for estimating a sequence where the memory length of the channel is set to L=2 is described in detail. FIG. 17 illustrates a model of a sequence estimator that is best adapted for the case where the memory length of the channel is L=2. The sequence estimator is so constructed as to reproduce a model similar to a model of a channel. However, in the sequence estimator shown in FIG. 17, means for adding noises are omitted from the model of the channel.

Specifically, the sequence estimator comprises: a memory having the same memory length as the memory length for the channel and receiving estimated values of the transmitted signal; a multiplication means for multiplying an estimated value of the transmitted signal produced from the memory by given tap coefficients; an adder means for calculating an estimated value (replica) of the received signal by summing up the products produced by the multiplication means; an error-calculating means for producing the differences between the estimated value (replica) of the received signal produced from the adder means and the actual received signal; and a squares sum-calculating means for taking the sum of squares of values produced from the error-calculating means. The given tap coefficients at which the multiplication means is set are the same as the tap coefficients obtained from the characteristics of the channel.

A method of making maximum likelihood estimates by the sequence estimator described thus far is described.

First, candidates for a transmitted signal of sequence length N are obtained.

Then, the candidates for the transmitted signal are entered into the memory of the sequence estimator. The multiplication means multiplies signals produced from the memory by tap coefficients $c_1$ and $c_2$. The signal produced without via the memory is multiplied by a tap coefficient $c_0$.

The adder means sums up the values produced by the multiplication means to obtain an estimated value (replica) of the received signal.

The difference-calculating means takes the difference between the estimated value (replica) of the received signal obtained by the adder means and the actually received signal.

The squares sum-calculating means takes the sum of squares of difference values produced from the difference-calculating means. The squares sum-calculating means sums up the squares of the differences between the estimated signal (replica) of the received signal and the received signal for every signal sequence.

Let N be the length of the transmission sequence length. There are $2^N$ candidates for this transmitted signal. The above-described processing is performed for every candidate.

The maximum likelihood estimator estimates that the candidate for the transmitted signal minimizing the squares sum produced from the squares sum-calculating means is the transmitted signal.

Prior Art Technique 2

In the case of the maximum likelihood estimates as described above, the amount of calculation increases in proportion to a power of the transmission sequence length N. Accordingly, maximum likelihood estimates adopting a procedure known as the Viterbi algorithm are used. The Viterbi algorithm is described in detail by G. D. Forney, Jr. in "The Viterbi algorithm", Proc. IEEE, Vol.61, No.3, pp. 268–278 (March 1973).

In the case of the channel model of FIG. 18, the error electric power at instant k can be calculated if data about transmission at the present instant k and data about transmission performed two instants earlier are known.

In the maximum likelihood estimates using the Viterbi algorithm, a diagram (hereinafter referred to as a trellis diagram) describing information about transitions of data arising from combinations of data at two instants as shown in FIG. 19 is used.

In this trellis diagram of FIG. 19, combinations of data at two instants of time are connected by lines, taking account of the following characteristics.

It is assumed, for example, that a signal stored in memory at some instant is in state 00. At the next instant, the state makes a transition either to state 10 or to state 00. However, transition to state 01 or state 11 does not occur, because if a shift register in 000 is shifted one clock time, only 000 or 100 is obtained.

Accordingly, when combinations of data at two instants are connected by lines, states 00 and 10 are connected by a line. Also, states 00 and 00 are connected by a line. No line is drawn between states 00 and 01. No line is drawn between states 00 and 11.

The trellis diagram is created by taking account of the characteristics of transitions in this way. In FIG. 19, a line connecting states indicates a possibility of a transition. No connecting line means that transition cannot occur. A line indicating a transition of state is hereinafter referred to as a branch. In the trellis diagram of FIG. 19, both solid lines and dotted lines are put. The solid lines indicate that signal 0 is applied, producing a transition of a state. The dotted lines indicate that signal 1 is applied, resulting in a transition of a state.

If combinations of data at two instants are connected by a line as in the trellis diagram of FIG. 19, a combination of data at three instants can be determined. By making use of this, the error electric power can be found.

Then, the contents of processing of the Viterbi algorithm using the trellis diagram of FIG. 19 are described in detail.

The number of states is determined by the Viterbi algorithm in the manner described now. Let L be the transmission memory length. The number is $2^L$. That is, the number of states increases in proportion to a power of the transmission memory length L. The amount of calculation increases according to the number of states.

In the prior art technique 1, every candidate for the transmitted signal must be searched for. In contrast, application of the Viterbi algorithm can reduce the number of processing steps.

The procedure for the processing of the Viterbi algorithm at each instant is illustrated in FIG. 20.

In the description given below, state xx at each instant k is given by s[k, xx]. At instant $k_1$, state xx occurs. A path through which a transition to state oo occurs at instant $k_2$ is given by $s[k_1, xx]/s[k_2, oo]$.

(1) First, the squares of errors from each branch (line segments in FIG. 19) are computed.

The squares of errors at each branch are referred to as branch metrics.

For instance, in the case of a branch connecting states s[0,00] and s[1,00], this branch indicates that data at three instants is 000. These items of data are multiplied by tap coefficients. The differences from the actual received signal are taken. The squares of the differences are taken. Thus, the squares of the errors are calculated.

The square of error at every branch is calculated by this method.

(2) Then, a path indicating transitions of a state going to states (00, 10, 01, 11 in FIG. 19) at some instant is extracted. The branch metrics of branches forming the extracted path are summed up. In this way, the path metric is calculated. Note that the path metric is calculated for every path in every state.

For example, paths going to s[2,00] include two paths, i.e., a path s[0,00]/s[1,00]/s[2,00] and a path s[0,11]/s[1,01]/s[2,00]. The path metrics of these two paths are calculated.

(3) The path metrics of the paths extracted from the states are compared. Such a comparison is made for every state.

(4) The path found to have the least path metric by the comparisons is regarded as a path of maximum likelihood. The path and the path metric are stored in memory. This storing of paths and path metrics is performed for each individual state.

The path found to have the least path metric by the comparisons is referred to as a surviving path. The path metric of this surviving path is referred to as a surviving path metric.

For example, of paths going to state s[2,00], the path metric of the path s[0,00]/s[1,00]/s[2,00] is compared with the path metric of the path s[0,11]/s[1,01]/s[2,00]. The smaller path becomes a surviving path.

(5) In the Viterbi algorithm, one is finally selected as a surviving path from plural paths going to some state.

The Viterbi algorithm performs the processing described thus far at each instant of time.

The Viterbi algorithm is conducted using the trellis diagram of FIG. 19. The results are shown in FIG. 21, which shows surviving paths finally obtained.

At the final instant of time, the above-described processing has been conducted for 1 frame. A path having the least path metric is selected as final paths from the surviving paths. In FIG. 21, the paths indicated by solid lines and solid broken lines, respectively, are final paths.

The estimator estimates that a signal sequence obtained from the final path is the transmitted signal.

The maximum likelihood estimation using the Viterbi algorithm as described thus far is referred to as Maximum Likelihood Sequence Estimation (MLSE), as described by G. D. Forney, Jr., in "Maximum-likelihood sequence estimation of digital sequences in the presence of intersymbol interference", IEEE Trans. Inform. Theory, Vol. IT-18, No. 3, pp. 363–378 (May 1972).

In this MLSE, the number of states of the Viterbi algorithm is $2^L$, where L is the channel memory length. A procedure for uniquely filling values of the channel memory from branches indicating state transitions is the MLSE. FIG. 21 shows a model of the channel memory where L=5. When the MLSE is applied to this model, the number of states is $2^5$, i.e., 32.

Prior Art Technique 3

The above-described MLSE can reduce the amount of processing compared with prior art technique 1. However, the number of states increases in proportion to a power of the channel memory length L. Therefore, the amount of processing is still exorbitant.

In an attempt to solve this problem, a procedure known as Decision-Feedback Sequence Estimation (DFSE) has been proposed by A. Duel-Hallen et. al in "Delayed decision-feedback sequence estimation", IEEE Trans. Commun., Vol. COM-37, 5, pp. 428–436, May 1989.

This procedure known as DFSE is a modification of the processing of the aforementioned MLSE.

The difference in operation between the DFSE and MLSE is briefly described by referring to FIG. 15. In FIG. 15, the number of channel memories is 5. Therefore, in order to fill all candidates, it is necessary to create states by five memories. In this case of MLSE, the number of states is 32.

On the other hand, in the case of the DFSE, the number of channel memories is 5. We take notice of two memories as memories used to create states. However, where states are created by the two memories, data about the latter three symbols is insufficient to fill the channel memories.

Accordingly, surviving paths connected to a state at instant k−1 are utilized. Values obtained from the surviving paths are used as the data about the latter three symbols.

Application of the DFSE described thus far can reduce the number of states from 32 down to 4.

The processing of the DFSE is described in detail by referring to FIG. 20, which illustrates generalized contents of processing of the DFSE at each instant of time.

< Processing from Instant k=1 to 3>

It is first assumed that data are known where k is negative and that every state exists under the condition k=0.

As can be seen from the trellis diagram of FIG. 19, either the path s[0,00]/s[1,00] or the path s[0,01]/s[1,00] is available in going to s[1,00]. Their path metrics are calculated and compared. Paths with smaller path metrics are selected as surviving paths. It is now assumed that the path s[0,00]/s[1,00] is selected as a surviving path.

Similarly, surviving paths going to states s[1,10], s[1,01] and s[1,11] are determined one by one.

By performing similar processing, surviving paths going to states are determined at instants k=2 and k=3.

By carrying out this processing, a surviving path shown in FIG. 2 is obtained up to instant k=3. Also, the path metrics of paths surviving up to k=3 are stored in memory.

< Processing at Instant k=4>

Processing for Calculating Branch Metrics: BMG-I

If state s[3,00]or state s[3,01] is available, state s[4,00] is obtained. Therefore, paths leading to the state s[4,00] include two paths, i.e., path s[0,01]/s[1,10]/s[2,01]/s[3,00]/s[4,00] and path s[0,01]/s[1,10]/s[2,11]/s[3,01]/s[4,00].

This path s[0,01]/s[1,10]/s[2,01]/s[3,00]/s[4,00] produces a candidate for a transmitted sequence "000101" at instant k=4. The path s[0,01]/s[1,10]/s[2,11]/s[3,01]/s[4,00] results in a candidate for a transmitted sequence "001101" at instant k=4. The branch metric at k=4 is calculated from this value.

Processing for Calculating Path Metrics: ADD-I

The path metrics of the above-described paths going to the state s[4,00] are calculated.

Path metrics up to k=3 were calculated and stored in memory. A branch metric at k=4 is now calculated and added to the stored metrics, thus producing path metrics. In particular, in the case of path s[0,01]/s[1,10]/s[2,01]/s[3,00]/s[4,00], a branch metric is added to the path metric about state s[3,00]. In the case of the path s[0,01]/s[1,10]/s[2,11]/s[3,01]/s[4,00], a branch metric is added to the path metric about state s[3,01].

Similar processing is performed for states s[4,10], s[4,01] and s[4,11].

Processing for Comparing Path Metrics: CMP-I

Then, the path metrics of two paths going to the state s[4,00] calculated in ADD-I are compared. That is, the path metric of the path s[0,01]/s[1,10]/s[2,01]/s[3,00]/s[4,00] is compared with the path metric of the path s[0,01]/s[1,10]/s[2,11]/s[3,01]/s[4,00]. This comparison of the path metrics is made by taking the difference between the selected path metrics (Processing for Selection: SEL).

Of the path metric of the path s[0,01]/s[1,10]/s[2,01]/s[3,00]/s[4,00] and the path metric of the path s[0,01]/s[1,10]/s[2,11]/s[3,01]/s[4,00], the path having a smaller path metric is selected as a surviving path going to s[4,00].

The processing of CMP-I and SEL described thus far is performed also about the states s[4,10 ], s[4,01], and s[4,11].

This processing is performed at every instant after k=5. The above-described processing is performed for about 1 frame. The path metrics of surviving paths obtained at the final instant about states are compared. The path having the least path metric is selected. This selected path is the final path.

The transmitted sequence is selected from the final path. The sequence estimator estimates that the obtained transmitted sequence is a sequence transmitted by the sender.

FIG. 22 is a block diagram of a sequence estimator performing the Viterbi algorithm illustrated in FIG. 20.

In FIG. 22, 1B is a branch metric-calculating portion. Indicated by 2B is a bus metric-calculating portion mounted on the output side of the branch metric-calculating portion 1B. Indicated by 4B is a compare-select processing portion mounted on the output side of the path metric-calculating portion 2B.

Indicated by 5 is a path metric memory mounted on the output side of the compare-select processing portion 4B and on the input side of the path metric-calculating portion 2B. Indicated by 6 is a surviving path memory connected with the branch metric-calculating portion 1B and with the compare-select processing portion 4B.

A received signal input terminal 7 receives a received signal. A channel characteristic input terminal 8 receives the characteristics of the channel, e.g., tap coefficients or the like described in the above-described embodiments. An output line 9 delivers surviving paths stored in the surviving path memory 6.

Then, the operation of this sequence estimator is described, corresponding to the contents of processing of FIG. 20. The branch metric-calculating portion 1B performs the BMG-I shown in FIG. 20.

The path metric-calculating portion 2B receives the branch metric calculated by the branch metric-calculating portion 1B and performs the ADD-I illustrated in FIG. 20.

The compare-select processing portion 4B receives the plural path metrics calculated by the path metric-calculating portion B and performs the CMP-I and SEL.

During the processing of SEL by the compare-select processing portion 4A, obtained surviving paths are stored in the surviving path memory 6. In addition, the path metrics of the surviving paths are stored in the path metric memory 5.

In the DFSE described thus far, attention is paid to the states of only two memories. Obviously, maximum likelihood is not obtained. Consequently, the characteristics of the MLSE are deteriorated. For example, in the non-minimum phase conditions illustrated in FIG. 14(*b*), signal components of memories to which the DFSE pays attention are reduced to a greater extent than signal components corresponding to other memories. Therefore, errors are introduced in selecting surviving paths. If an error is produced once in selecting surviving paths, the error occurs repeatedly. This phenomenon is known as error propagation. Thus, the characteristics are deteriorated greatly.

On the other hand, the MLSE has ideal characteristics but is impractical because of an exorbitant amount of calculation.

DISCLOSURE OF THE INVENTION

It is an object of this invention to estimate a transmitted sequence more precisely with a less amount of calculation.

A method of estimating a sequence in accordance with the present invention uses the Viterbi algorithm to select surviving paths from paths indicating transitions of states of combinations of data at a first instant up to a second instant. The surviving paths correspond to states of combinations of plural data items at the second instant. A signal sequence transmitted by a sender is estimated from a received signal and from the characteristics of a channel. This method comprises the steps of: calculating path metrics of paths going from states at the first instant to states at the second instant; deriving modified paths that are modifications of the paths going from the states at the first instant to the states at the second instant; calculating the path metrics of the modified paths derived by the modified path-deriving step; correcting the paths going from the states at the first instant to the states at the second instant according to results of the calculations performed by the first path metric-calculating step and the second path metric-calculating step; determining a surviving path going to the states at the second instant from the plural paths going from the states at the first instant to the states at the second instant through the corrected paths; performing the first path metric-calculating step, the modified path-deriving step, the second path metric-calculating step, and the path-correcting step for each of the states of combinations of the plural data items at the second instant; then selecting a final path from surviving paths determined for each of the combinations of the data items at the second instant according to path metrics of the surviving paths; and estimating a signal sequence obtained from the final path selected by the final path-selecting step as a transmitted signal sequence.

The above-described step for deriving modified paths modifies parts of paths going from the states at the first instant to the states at the second instant according to the characteristics of the channel.

In addition, the above-described step for deriving modified paths modifies branches occurring at a certain instant earlier than the second instant of those branches going from the states at the first instant to the states at the second instant.

The certain instant described above is determined according to the degree of influence on the received signal.

Moreover, the above-described step for deriving modified paths modifies plural branches of those branches which go from the states at the first instant to the states at the second instant.

The above-described step for determining surviving paths determines surviving paths going to the states at the second instant according to the path metrics of plural paths going from the states at the first instant to the states at the second instants through the paths modified by the path-modifying step.

A step is also included to take the differences between the path metrics of plural paths going from the states at the first instant to the states at the second instant through the paths modified by the path-modifying step. The second path metric-calculating step calculates the path metrics of the modified paths from the path metrics previously calculated by the path metric difference-calculating step and from the path metrics of the paths going from the states at the first instant to the states at the second instant, the path metrics being calculated by the first path metric-calculating step.

The first path metric-calculating step, the modified path-introducing step, the second path metric-calculating step, the path-modifying step, and the surviving path-determining step are executed repeatedly according to results of the determination made by the surviving-determining step. The final path-selecting step selects a final path from surviving paths obtained by the repeated execution.

A sequence estimator in accordance with the present invention lies in a sequence estimator for estimating the sequence of a signal transmitted from a sender according to the received signal and the characteristics of the channel by making use of the Viterbi algorithm for selecting surviving paths from paths indicating transitions of states of combinations of data at a first instant up to a second instant, the surviving paths respectively corresponding to the states of combinations of data at the second instant. This sequence estimator comprises: a path metric-calculating means for path metrics of modifications of paths going from the states at the first instant to the states at the second instant, as well as the path metrics of paths going from the states at the first instant to the states at the second instant; a path-modifying means for modifying the paths going from the states at the first instant to the states at the second instant according to the results of calculations performed by the path metric-calculating means; a surviving path-determining means for determining surviving paths going to the states at the second instant from paths going from the states at the first instant to the states at the second instant through the paths modified by the path-modifying means; a final path-selecting means for selecting a final path from surviving paths determined about combinations of data items at the second instant by the surviving path-determining means according to the path metrics of the surviving paths; and an estimating means for estimating a signal sequence obtained from the final path selected by the final path-selecting means as the sequence of a transmitted signal.

BRIEF DESCRIPTION OF THE DRAWINGS

FIG. 14 is an electric power distribution diagram showing tap coefficients of 4 taps;

FIG. 15 is a diagram briefly illustrating the differences between the processing of MLSE and the processing of DFSE;

BEST MODE FOR CARRYING OUT THE INVENTION

Embodiments of the present invention are hereinafter described.

Embodiment 1

Figure 1:
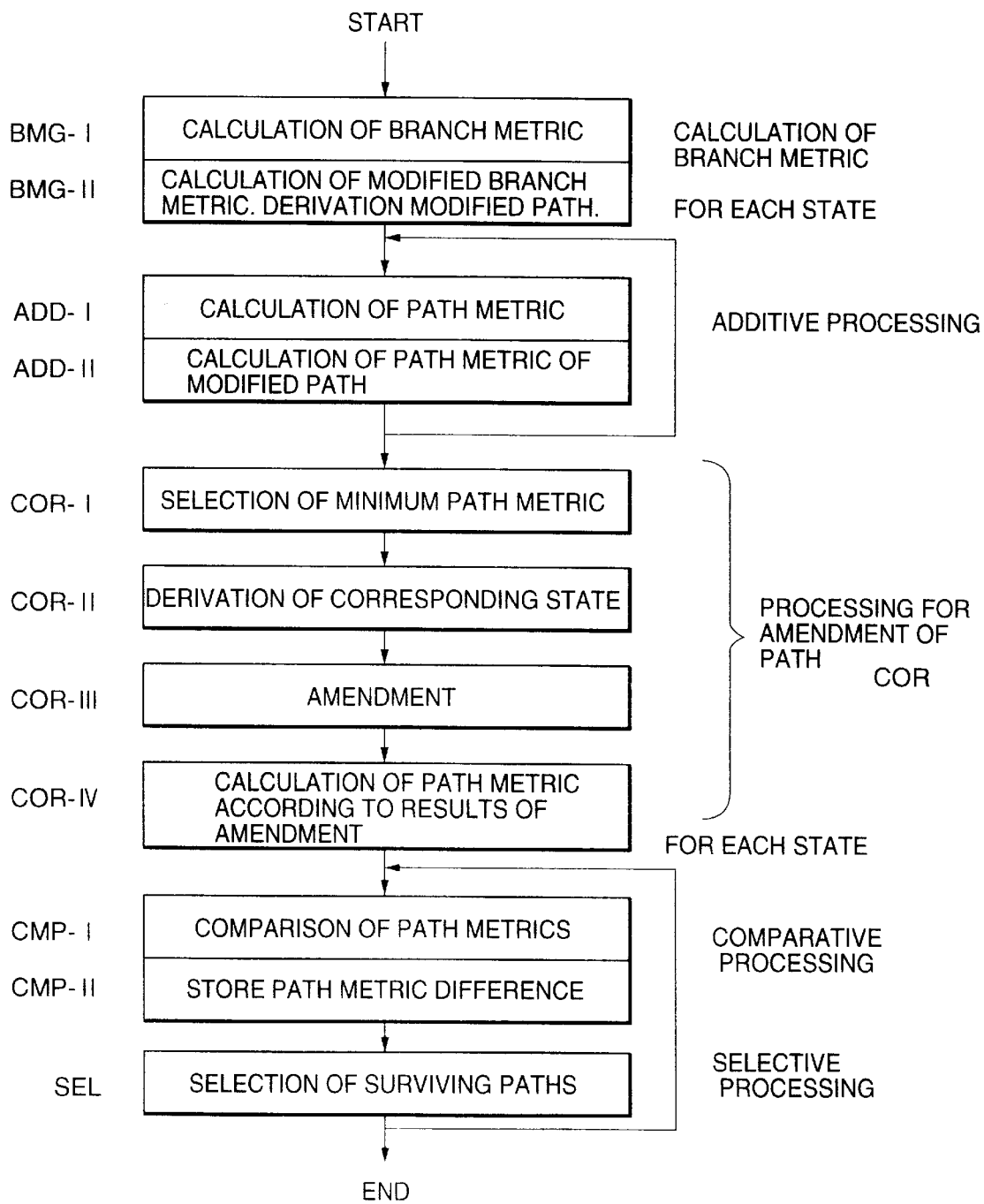
FIG. 1 is a flowchart illustrating a procedure for processing by a sequence estimation method according to Embodiment 1.

FIG. 1 illustrates the flow according to the present invention at instant k. To elucidate the differences with the prior art techniques, processing steps newly added are surrounded by thick lines.

Main differences between the present invention and the prior art techniques are as follows.

Branch metrics and path metrics where surviving paths preceded by certain instants are modified are calculated, as well as normal branches/path metrics.

Path metrics obtained where the surviving paths are not modified are compared, and a decision is made as to whether the surviving paths should be modified. In addition, a path metric used for processing for comparisons and selection is selected according to the result of the amendment for each branch.

The processing for comparisons and selection is performed about the path metrics selected for each state. Processing for storing metric differences in memory is added.

Figure 13:
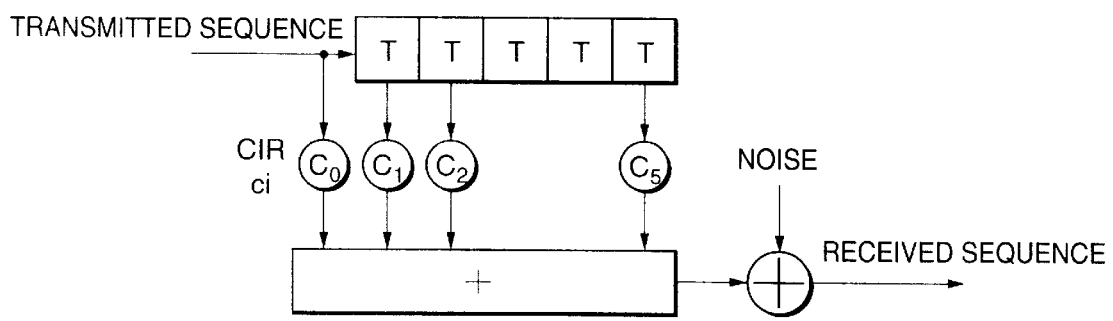
FIG. 13 is a diagram illustrating a model of a 4-tap channel to which the sequence estimation method according to Embodiment 1 is applied.
Figure 16:
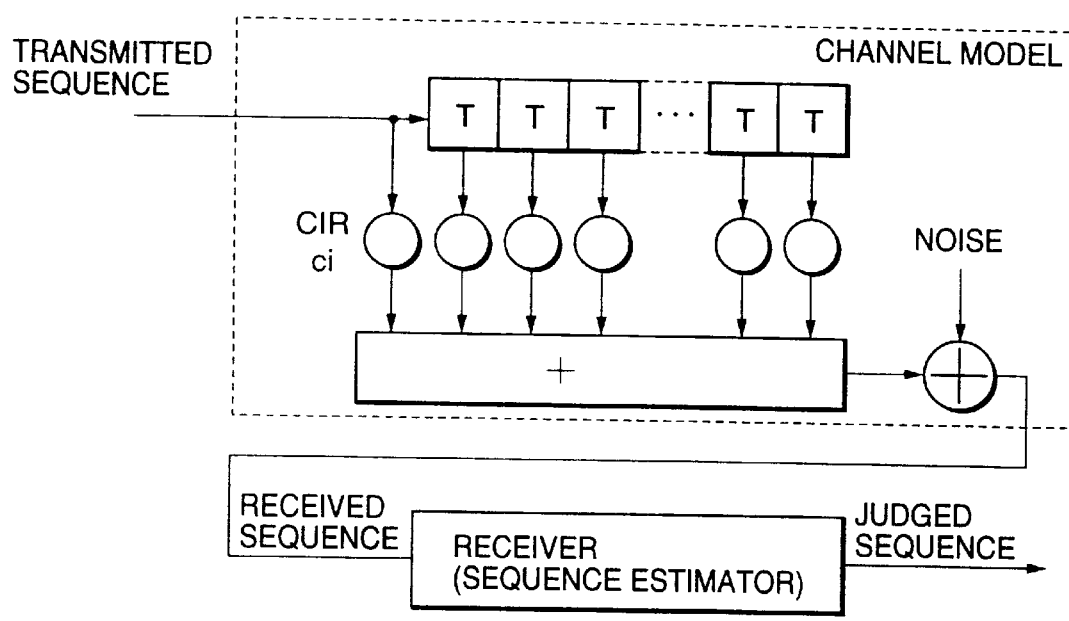
FIG. 16 is a diagram illustrating models of a channel and of sequence estimations.
Figure 17:
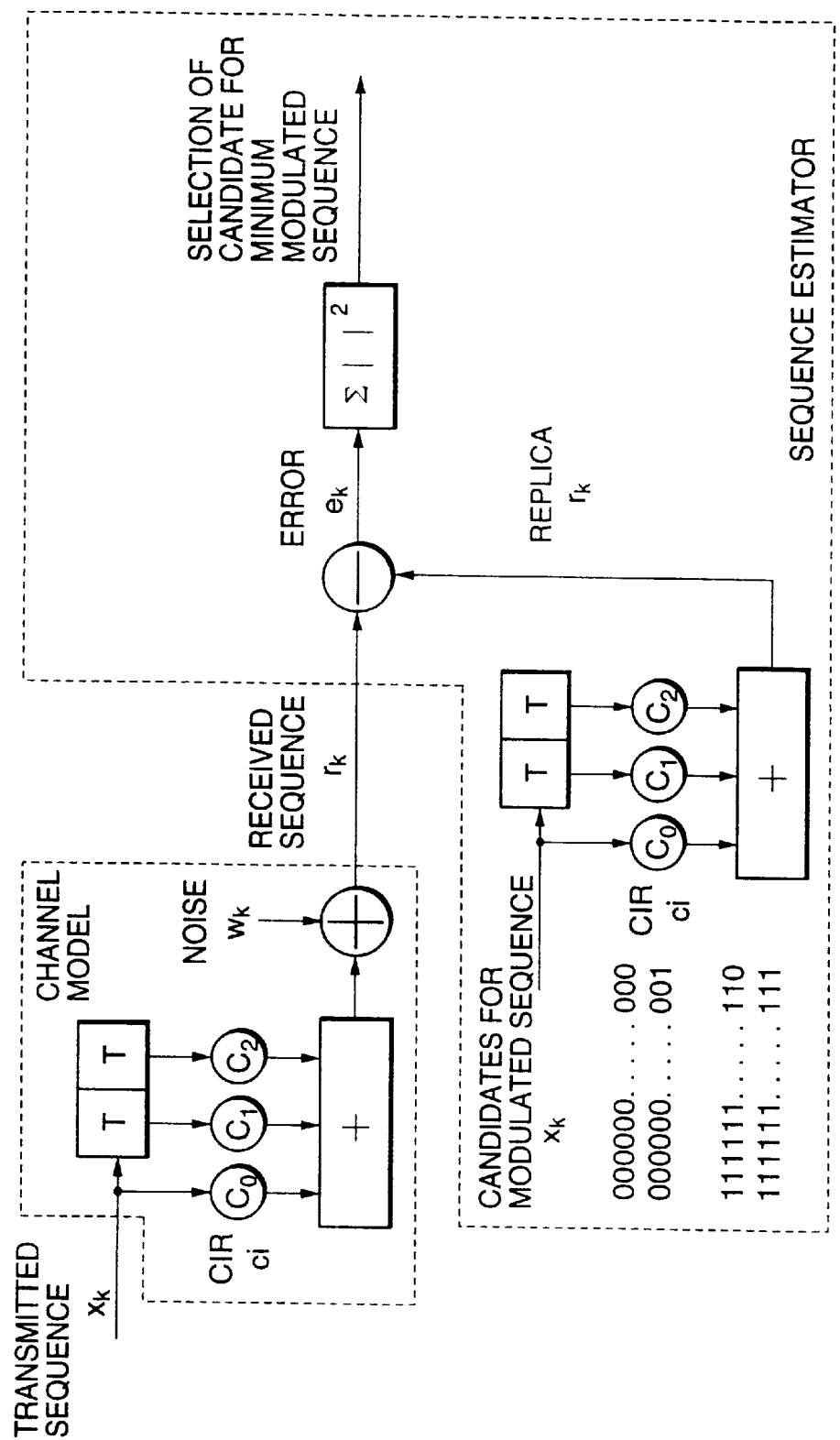
FIG. 17 is a diagram illustrating a model of maximum likelihood estimations.
Figure 18:
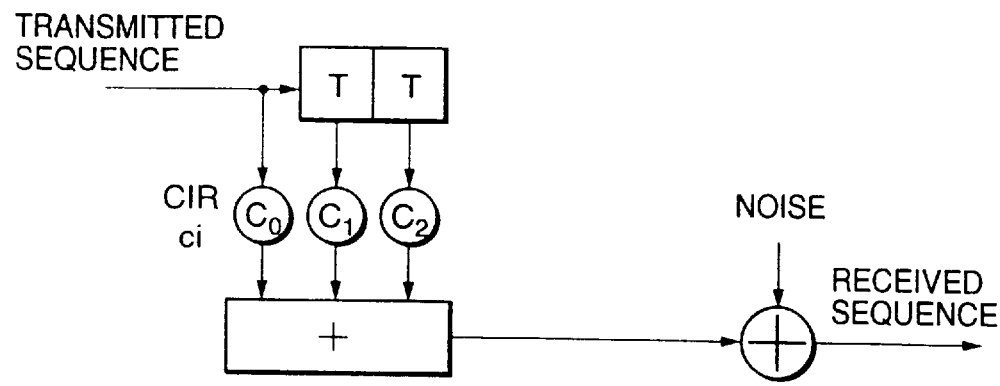
FIG. 18 is a diagram illustrating a 3-tap channel model.

To explain these differences more clearly, the operation of the present invention is described in detail, using a channel model of FIG. 13.

The channel model of FIG. 13 is a model applied to a channel having tap coefficients as shown in FIG. 14(*b*). That is, this is a model applied to a channel having none of tap coefficients $c_3$ to $c_4$.

Especially, this form is a channel model where the value of a tap coefficient $c_5$ is greater than other tap coefficients as in non-minimum phase conditions as shown in FIG. 14(*b*). This channel model indicates that the electric power of a signal received via a reflection or the like after a lapse of a given time is greater than the electric power of a signal directly received from a sender, for example. A channel expressed in terms of the channel model described above is hereinafter described.

A procedure for processing at each instant in this embodiment is described in detail.

< Processing up to Instants k=1 to 3>

It is first assumed that data obtained where instant k is negative is known and that every state exists at instant k=0.

Figure 19:
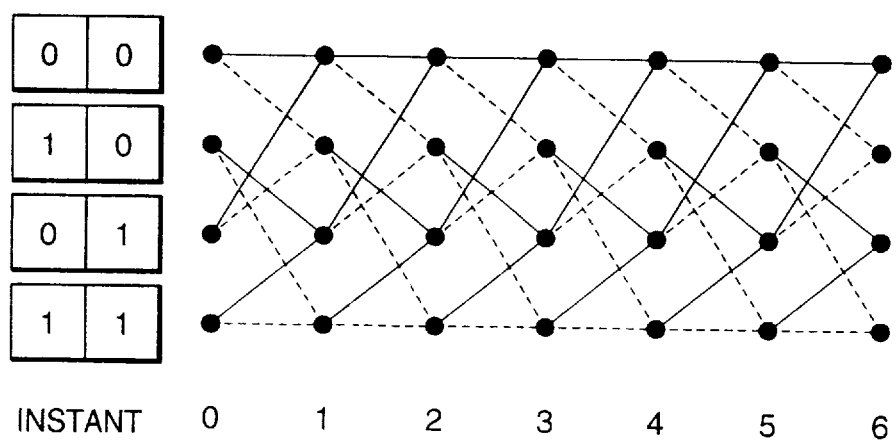
FIG. 19 is a trellis diagram.
Figure 20:
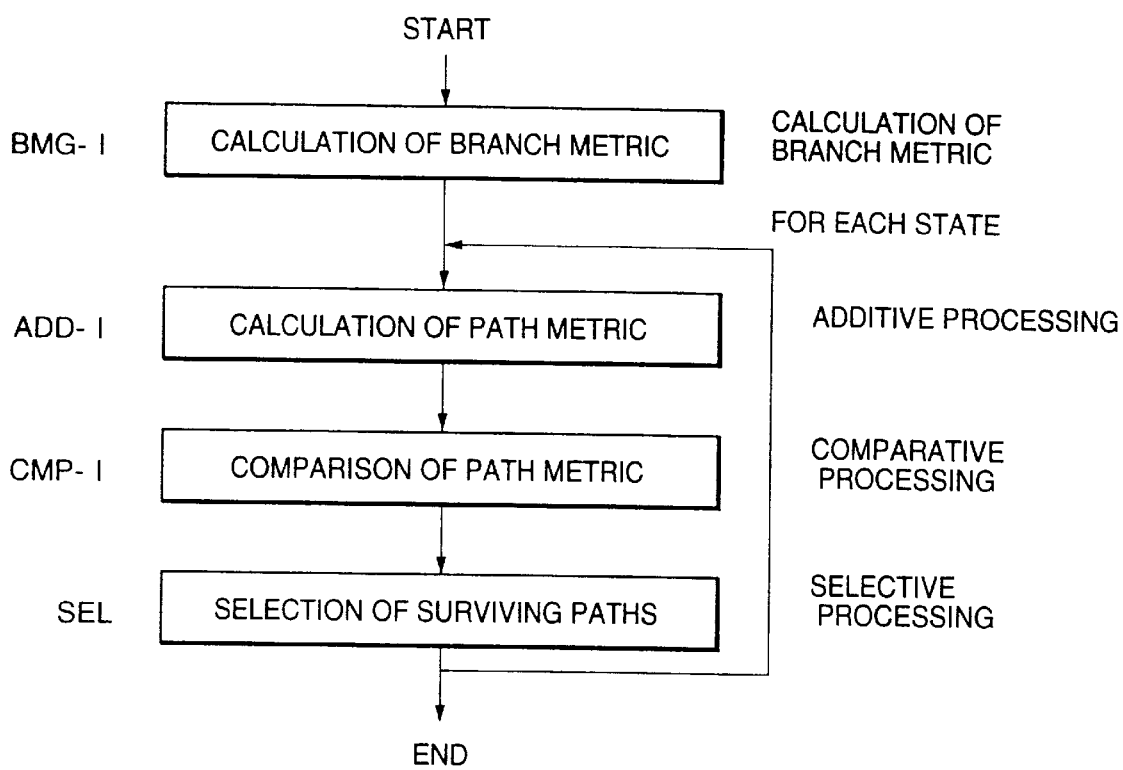
FIG. 20 is a flowchart illustrating a procedure for the prior art sequence estimation method.
Figure 21:
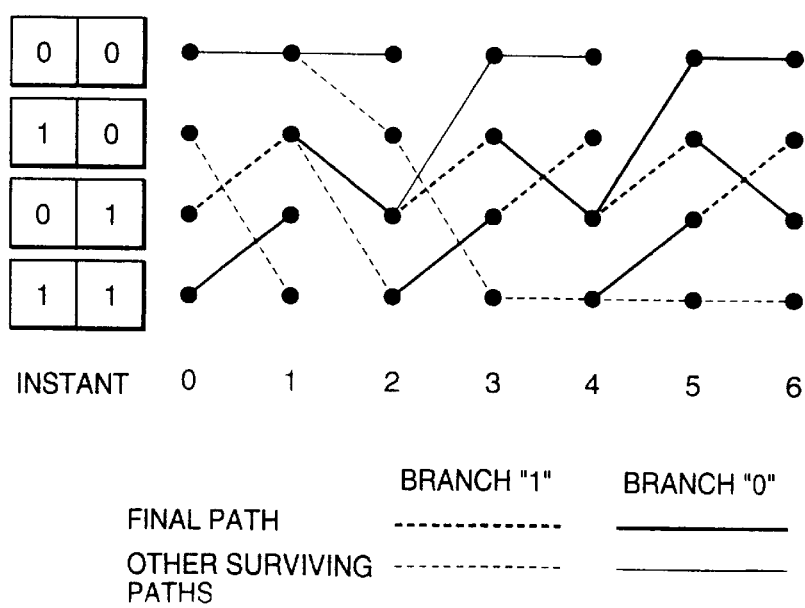
FIG. 21 is a diagram illustrating a final path obtained by the prior art sequence estimation method.
Figure 22:
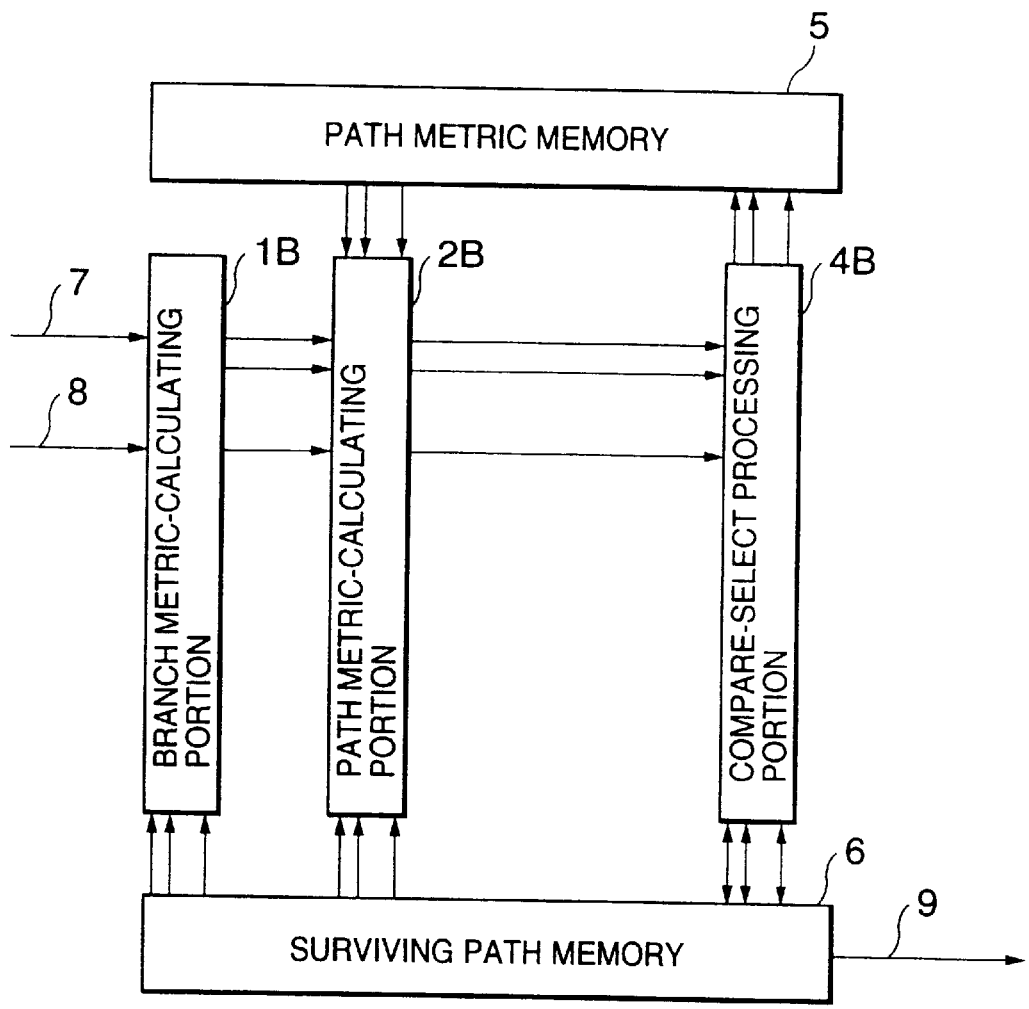
FIG. 22 is a block diagram of the prior art sequence estimator.

As can be seen from the trellis diagram of FIG. 19, either a path s[0,00]/s[1,00] or a path s[0,01]/s[1,00] is available in reaching s[1,00]. Their path metrics are calculated and compared. The path having a smaller path metric is selected as a surviving path. In this example, the path s[0,00]/s[1,00] is selected as a surviving path.

Similarly, surviving paths going to states s[1,10], s[1,01], and s[1,1] are selected as surviving paths one by one.

By performing similar processing, surviving paths going to states are determined also about instants k=2 and k=3.

By carrying out the processing described above, surviving paths shown in FIG. 2 are obtained until instant k=3. The path metric of the surviving path until instant k=3 is stored in memory, in addition to the differences in path metric between the selected path and discarded paths.

< Processing at Instant k=4>

During processing from instant k=1 to 3, the surviving path in states[1,10] was set to s[0,01]/s[1,10]. Hereinafter, processing for modifying the path s[0,01]/s[1,10] to s[0,00]/s[1,10] is described.

"Calculation of Path Metrics of Paths Going to State s[4, 00]"

Processing for Calculation of Branch Metrics: BMG-I

Figure 2:
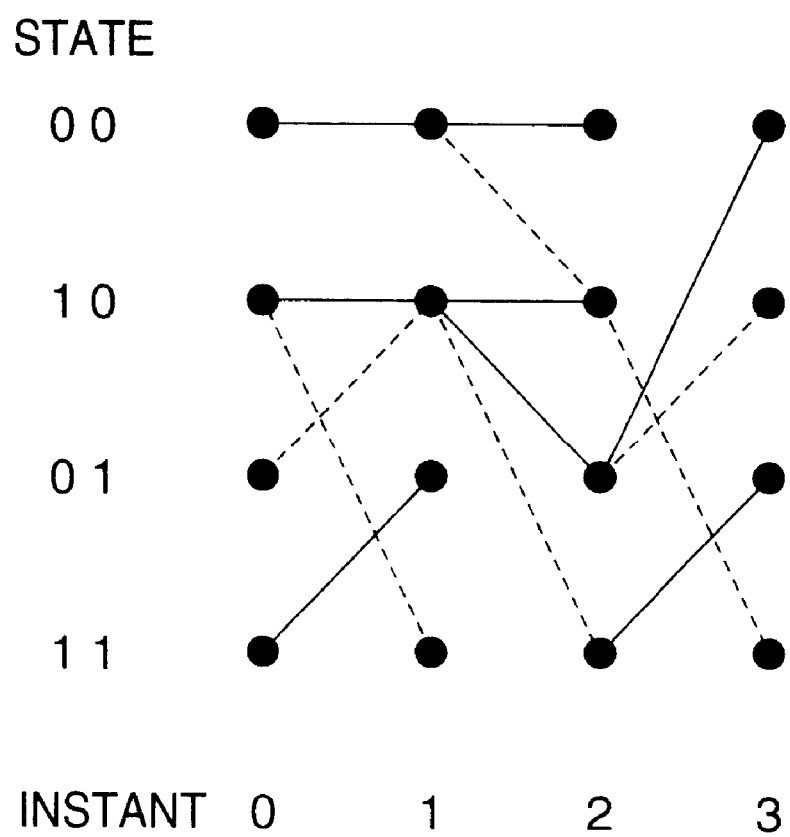
FIG. 2 is a diagram illustrating surviving paths at instant k=3.

To obtain state s[4,00], either state s[3,00] or state s[3,01] should be available. Therefore, paths that can go to the state s[4,00] include two paths, or path s[0,01]/s[1,10]/s[2,01]/s[3,00]/s[4,00] and path s[0,01]/s[1,10]/s[2,11]/s[3,01]/s[4, 00], which lead to surviving paths at k=3 as shown in FIG. 2.

A candidate "000101" for a transmitted sequence at instant k=4 is available from this path s[0,01]/s[1,10]/s[2, 01]/s[3,00]/s[4,00]. A candidate "001101" for a transmitted sequence at instant k=4 is obtained from the path s[0,01]/s[1,10]/s[2,11]/s[3,01]/s[4,00].

Modifications, Calculations of Branch Metrics, and Derivation of Modified Paths: BMG-II Then, a transmitted sequence is obtained in which a value corresponding to the tap coefficient $c_5$ of the transmitted sequence candidates has been modified.

The modification of the value corresponding to the tap coefficient $c_5$ of the transmitted sequence candidates produces "000100" and "001100". The "000100" is a modification of the above-described transmitted sequence "000101". The "001100" is a modification of the above-described transmitted sequence "001101". The modification referred to herein means a modification of "0" of certain values existing in a transmitted sequence to "1" or a modification of "1" of certain values existing in a transmitted sequence to "0".

The path corresponding to the modified transmitted sequence "000100" is s[0,00]/s[1,10]/s[2,01]/s[3,00]/s[4, 00]. The path corresponding to the modified transmitted line "001100" is path s[0,00]/s[1,10]/s[2,11]/s[3,01]/s[4,00]. Paths obtained in this way will be hereinafter referred to as modified paths. On the other hand, paths not yet modified are referred to as normal paths.

Figure 3:
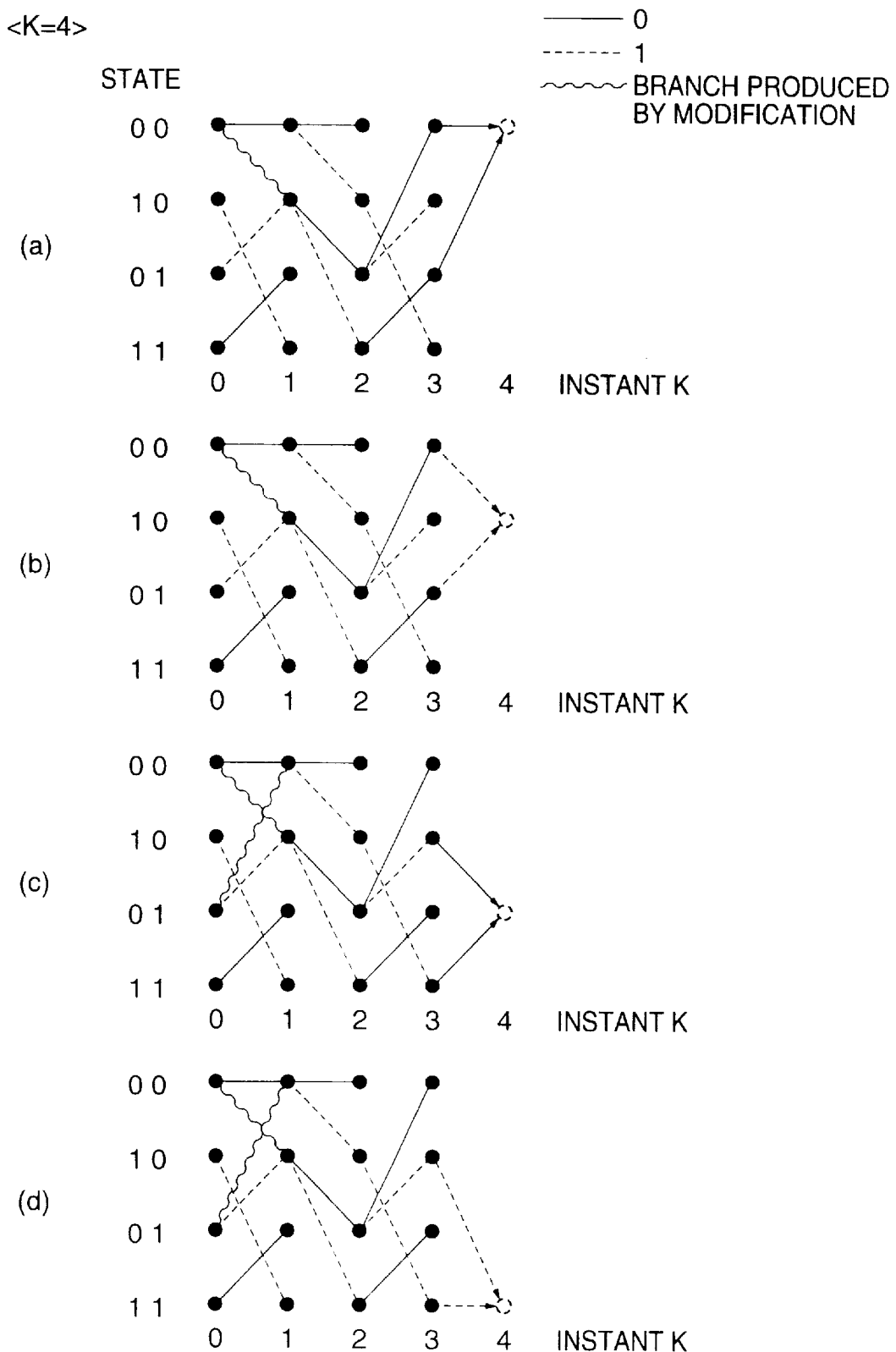
FIG. 3 is a diagram illustrating normal paths created for states at instant k=4 and modified paths.

Four paths going to s[4,00] and obtained in this way are shown in FIG. 3(*a*). In FIG. 3, wavy lines are branches produced by modifications. As can be seen from FIG. 3, it can be said that modified paths are modifications of branches produced at certain instants earlier than normal paths.

Thereafter, branch metrics are calculated from transmitted sequences "000101" and "001101" and from modified transmitted sequences "000100" and "001100". These branch metrics can be calculated by the same method as the prior art procedure for calculating branch metrics.

Processing for Calculations of Path Metrics: ADD-I

Path metrics of normal paths and of modified paths are calculated.

Normal path metrics are obtained by adding a newly calculated branch metric at k=4 to path metrics (up to k=3) previously calculated and stored in memory.

Processing of Calculations of Path Metrics of Modified Paths: ADD-II

The path metrics of modified paths are calculated in the manner described below.

A modified path s[0,00]/s[1,10]/s[2,01]/s[3,00]/s[4,00] differs from a path s[0,01]/s[1,10]/s[2,01]/s[3,00]/s[4,00] in branches s[0,00]/s[1,10] and s[0,01]/s[1,10].

Therefore, the difference (hereinafter referred to as the path metric difference) between the path metric of s[0,00]/s[1,10] and the path metric of s[0,01]/s[1,10] is added to the path metric of a path s[0,01]/s[1,10]/s[2,01]/s[3,00]/s[4,00] to thereby find the path metric of the modified path. The path metric difference used here, i.e., the difference between the paths s[0,00]/s[1,10] and s[0,01]/s[1,10], is produced by subtracting the path metric of the surviving path from the path metric of an abandoned path metric. The value calculated and stored in memory at instant k=1 is used as this value.

With respect to another modified path s[0,00]/s[1,10]/s[2, 11]s[3,01]/s[4,00], its path metric is calculated similarly, based on the path metric of the path s[0,01]/s[1,10]/s[2,11]/ s[3,01]/s[4,00].

In this way, the path metric difference calculated in the past is stored in memory and will be used for calculations of modified paths in the future. In consequence, the amount of calculation necessary for calculation of the path metric of a modified path can be reduced.

By performing the processing described thus far, the path metrics of normal paths and modified paths can be computed. In this example, four path metrics in total are calculated and stored in memory once.

"Calculation of Path Metrics of Paths Going to State s[4, 10]"

Processing for Calculations of Branch Metrics: BMG-I
Processing for Calculations of Modified Branch Metrics and Derivation of Modified Paths:BMG-II Paths going to the state s [4,10] are determined similarly to the processing described above.

Either state s[3,00] or state s[3,01] should be available to reach the state s[4,10]. Accordingly, paths leading to the state s[4,10] include two paths, i.e., s[0,01]/s[1,10]/s[2,01]/ s[3,00]/s[4,10] and s[0,01]/s[1,10]/s[2,11]/s[3,01]/4[4,10].

A candidate "100101" for a transmitted sequence is obtained at instant k=4 from this path s[0,01]/s[1,10]/s[2, 01]/s[3,00]/[4,10]. A candidate "101101" for a transmitted sequence is obtained at instant k=4 from the path s[0,01]/s [1,10]/s[2,11]/s[3,01]/[4,10].

Then, "100100" and "101100" are obtained by modifying values corresponding to the tap coefficient $c_5$ of the transmitted sequence candidates.

Branch metrics of the transmitted sequences "100101" and "101101" and of modified transmitted sequences "100100" and "101100" are calculated.

Modified paths corresponding to the modified transmitted sequences are created. The modified paths are path s[0,00]/ s[1,10]/s[2,01]/s[3,00]/s[4,10] and path s[0,00]/s[1,10]/s[2, 11]/s[3,01]/s[4,10].

Four paths going to the state s[4,10] obtained in this way are shown in FIG. 3(b).

Processing for Calculations of the Path Metrics of Normal Paths and the Path Metrics of Modified Paths: ADD-I, ADD-II Then, the path metrics of normal paths and modified paths going to the state s[4,10] are calculated. The method of calculations of the path metrics is the same as in the case of the state s[4,00].

By performing the processing described thus far, the path metrics of surviving paths and modified paths can be calculated. It follows in this example that four path metrics in total can be computed.

Calculations of Path Metrics of Paths Going to State s[4,01] and Path Metrics of Paths Going to State s[4,11]

The path metrics of the paths going to state s[4,01] and the path metrics of the paths going to state s[4,11] are calculated by processing similar to the foregoing.

As a result of the processing described thus far, four paths are available as paths going to s[4,01] as shown in FIG. 3(c). Four paths are obtained as paths going to s[4,11] as shown in FIG. 3(d).

Processing for Modification of Paths: COR
(a) Selection of Minimum Path Metrics: COR-I Then, the minimum one of the path metrics of the four path metrics calculated for each state is selected. In this embodiment, description is made under the following conditions: path s[0,00]/s[1,10]/s[2,01]/s[3,00]/s[4,00] is selected about the state s4[4,00]; path s[0,01]/s[1,10]/s[2, 11]/s[3,01]/s[4,10] is selected about the state s[4,10]; path s[0,00]/s[1,10]/s[2,01]/s[3,10]/s[4,01] is selected about the state s[4,01]; and path s[0,00]/s[1,00]/s[2,10]/s[3,11]/s[4,11] is selected about the state s[4,11].

(b) Derivation of Corresponding States: COR-II

These selected paths are followed, and the estimator confirms whether selected paths go to the same state. In particular, the following processing is executed.

Of the selected path, paths going to state s[4,00], paths going to state s[4,10], and paths going to state s[4,01] all pass through state s[1,10]. Observation of the history leading to the state s[1,10] reveals that paths having a branch s[0,00]/s[1,10] and paths having a branch s[0,01]/s[1,10] are included in those paths.

(c) Correction of Surviving Paths: COR-III

Accordingly, the path with the smallest path metric is selected from these three paths. Branches occurring earlier than s[1,10] are corrected according to the selected path. The corrective method is implemented as follows.

It is assumed that the path having the least path metric of the paths going to state s[4,00], going to state s[4,10], and going to state s[4,01], respectively, is selected as a path going to the state s[4,01]. Paths going to s[4,01] have a branch s[0,00]/s[1,10]. Therefore, a surviving branch connected to s[1,10] of the trellis diagram of FIG. 19 is corrected to s[0,00]/s[1,10].

(d) Selection of Path Metrics According to Corrected Paths: COR-IV

At this instant, it is determined that the surviving branch at instant k=1 is s[0,00]/s[1,10].

The path metric of path s[0,00]/s[1,10]/s[2,01]/s[3,00]/s [4,00] having s[0,00]/s[1,10] and the path metric of path s[0,00]/s[1,10]/s[2,11]/s[3,01]/s[4,00] are selected from the path metrics of the four path going to s[4,00], the latter path metrics being once stored in memory.

Processing for Comparison of Path Metrics: CMP-I

Then, the path metrics of the selected paths s[0,00]/s[1, 10]/s[2,01]/s[3,00]/s[4,00] and s[0,00]/s[1,10]/s[2,11]/s[3, 01]/s[4,00] are compared. The comparison of the path metrics is carried out by taking the difference between the selected path metrics.

Processing for Storing Path Metric Difference in Memory: CMP-II

The path metric difference calculated in the processing for comparison of path metrics is stored in memory for later processing.

Processing for Selection: SEL

Of the path metric of path s[0,00]/s[1,10]/s[2,01]/s[3,00]/ s[4,00] and the path metric of path s[0,00]/s[1,10]/s[2,11]/ s[3,01]/s[4,00], the path having a smaller path metric is selected as a surviving path going to s[4,00]. Paths heretofore stored in memory are updated according to this selection.

These kinds of processing CMP-I, CMP-II, and SEL described above are carried out about states s[4,10], s[4,01], and s[4,11].

By performing these kinds of processing, s[0,00]/s[1,10]/ s[2,01]/s[3,00]/[4,00] is selected as a surviving path going to state s[4,00]. Also, s[0,00]/s[1,10]/s[2,11]/s[3,01]/[4,10] is selected as a path going to the state s[4,10]. In addition, s[0,00]/s[1,10]/s[2,01]/s[3,10]/[4,01] is selected as a path going to the state s[4,01]. Furthermore, s[0,00]/s[1,00]/s[2,10]/s[3,11]/[4,11] is available as apath going to the state s[4,11].

Figure 4:
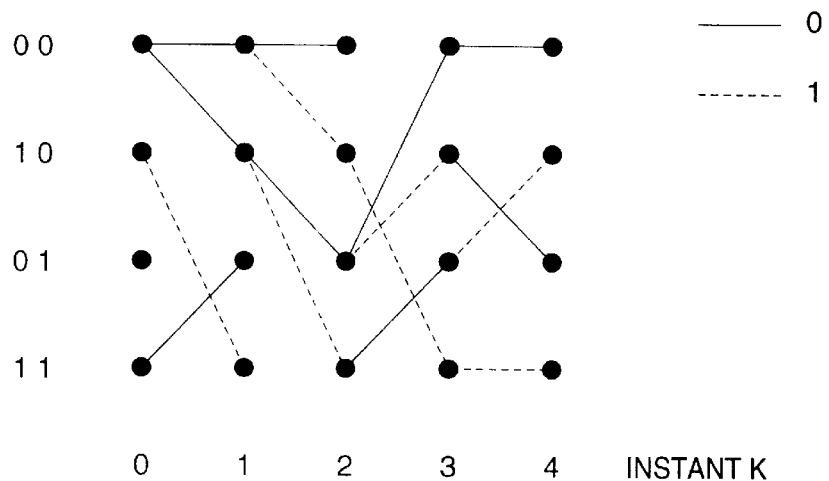
FIG. 4 is a diagram illustrating surviving paths at instant k=4.

Surviving paths obtained at k=4 are shown in FIG. 4.
<Processing at Instant k=5>
Processing for Calculations of Branch Metrics: BMG-I, BMG-II and Calculations of Path Metrics: ADD-I, ADD-II Also, at instant k=5, the processing for calculating branch metrics and the processing for calculating path metrics are performed in the same way as at k=4. Then, normal paths going to various states and path metrics of modified paths are calculated.

At instant k=5, paths going to state s[5,00] include both path s[0,00]/s[1,10]/s[2,01]/s[3,00]/s[4,00]/s[5,00] and path s[0,00]/s[1,10]/s[2,01]/s[3,10]/s[4,01]/s[5,00].

From these paths, a modified path s[0,10]/s[1,11]/s[2,01]/s[3,00]/[4,00]/s[5,00] and a modified path s[0,10]/s[1,11]/s[2,01]/s[3,10]/s[4,01]/s[5,00] are obtained. Since the procedure for obtaining the modified paths is the same as the procedure at k=4, the description is omitted.

Figure 5:
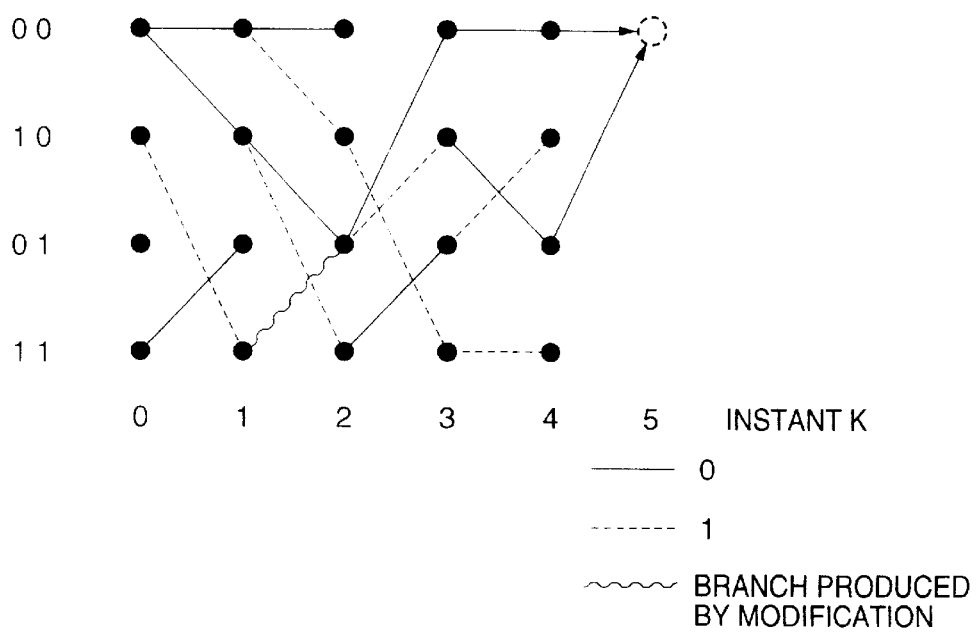
FIG. 5 is a diagram illustrating normal paths going to state 00 at instant k=5 and modified paths.

Four paths going to state s[5,00] are as shown in FIG. 5.

Accordingly, the path metrics of these four paths are computed.

Four paths are obtained for each of the other states. The path metrics of these paths are calculated.
Processing for Corrections: COR
(a) Selection of Minimum Path Metric: COR-I The least path metric of the four path metrics calculated for each state is selected.

In this example, s[0,00]/s[1,10]/s[2,01]/s[3,10]/s[4,01]/s[5,00] is selected as a path going to state s[5,00], and s[0,10]/s[1,11]/s[2,01]/s[3,10]/s[4,01]/s[5,10] is selected as a path going to state s[5,10].

It is also assumed that s[0,11]/s[1,01]/s[2,10]/s[3,11]/s[4,11]/s[5,01] is selected as a path going to state s[5,01] and that s[0,00]/s[1,00]/s[2,10]/s[3,11]/s[4,11]/s[5,11] is selected as a path going to state s[5,11].
(b) Derivation of Corresponding State: COR-II These selected paths are followed, and the estimator confirms whether the selected paths pass through the same state. Specifically, the following processing is conducted.

Of the selected paths, paths going to state s[5,00] and paths going to state s[5,10] pass through s[2,01]. With respect to the route going to s[2,01], one passes through s[0,00]/s[1,10]/s[2,01], while the other passes through s[0,10]/s[1,11]/s[2,01].

Paths going to state "01" and paths going to state "11" pass through s[2,10]. With respect to the route going to s[2,10], one passes through s[0,11]/s[1,01]/s[2,10], whereas the other passes through s[0,00]/s[1,00]/s[2,10].
(c) Correction of Paths: COR-III Of the paths going to state "00" and paths going to state "10", a path having a smaller path metric is selected. It is now assumed that the path metric of the path going to state "00" is smaller than the path metric of the path going to state "10".

In this case, with respect to the path going to state "10", the path is corrected according to the path going to the state "00" so as to pass through s[0,00]/s[1,10]/s[2,01]. No correction is made to the path going to the state "00".

The path going to the state "01" is corrected so as to pass through s[0,00]/s[1,00]/s[2,10] according to the path going to the state "11". The path going to the state "11" is not corrected. It is assumed that the path metric of the path going to the state "11" is smaller than the path metric of the path going to the state "01".

(d) Selection of Path Metric According to Results of Correction: COR-IV

As a result of the processing for correcting surviving paths, the path going to the state "10" and the path going to the state "01" are amended. Therefore, with respect to these paths, the path metrics of the paths according to the correction are selected.

The path metric of the path s[0,00]/s[1,10]/s[2,01]/s[3,10]/s[4,01]/s[5,10] having s[0,00]/s[1,10]/s[2,01] and the path metric of the path s[0,00]/s[1,10]/s[2,01]/s[3,00]/s[4,00]/s[5,10] are selected from the path metrics of four paths going to s[5,10] once stored in memory.

With respect to paths going to the state "01", the path metric of the path s[0,00]/s[1,00]/s[2,10]/s[3,01]/s[4,11]/s[5,01] having s[0,00]/s[1,00]/s[2,10] is selected from the path metrics of the four paths going to s[5,01] once stored in memory.
Processing for Comparisons: CMP-I and Processing for Storing in Memory: CMP-II Then, the path metric of the selected path s[0,00]/s[1,10]/s[2,01]/s[3,10]/s[4,01]/s[5,10] and the path metric of the path s[0,00]/s[1,10]/s[2,01]/s[3,00]/s[4,00]/s[5,10]. The calculated difference in the path metric for the comparison is stored in memory.

With respect to paths going to the state "01", the path having s[0,00]/s[1,00]/s[2,10] is only path s[0,00]/s[1,00]/s[2,10]/s[3,01]/s[4,11]/s[5,01]. Therefore, no comparison is necessary.
Processing for Selection: SEL Of the path metrics of paths s[0,00]/s[1,10]/s[2,01]/s[3,10]/s[4,01]/s[5,10] and s[0,00]/s[1,10]/s[2,01]/s[3,00]/s[4,00]/s[5,10], the path having a smaller path metric is selected as a surviving path going to s[5,10].

These kinds of processing CMP-I, CMP-II, and SEL described thus far are performed for each of states s[5,00], s[5,01], and s[5,11]. However, with respect to paths which go to the state "00" and which have not been corrected and with respect to path going to the state "11", the processing for comparisons and selection is not necessary. A path selected as a path having the least path metric in the processing for selection of the minimum path metric is determined as a surviving path.

Figure 6:
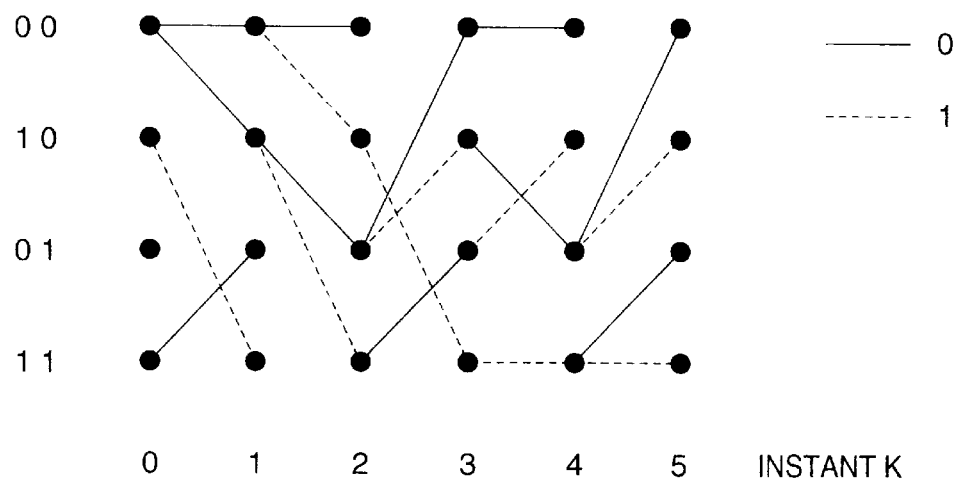
FIG. 6 is a diagram illustrating surviving paths at instant k=6.

Surviving paths determined in this way are shown in FIG. 6.
<Processing After Instant k=6>

Surviving paths going to states are determined by performing processing similar to processing at k=5 even after instant k=6.

The processing described thus far is performed at each instant. Generalized processing at each instant is shown in FIG. 1. The processing at each instant corresponds to the contents of the processing shown in FIG. 1.
<Processing for Estimating Transmitted Sequence>

The processing shown in FIG. 1 is performed until one frame is completed. The path metrics of surviving paths obtained for each state at the final instant are compared, and a path having the least path metric is selected. This selected path is the final path.

The transmitted sequence is extracted from this final path. The estimator estimates that the obtained transmitted sequence is a sequence transmitted by the sender.

Figure 7:
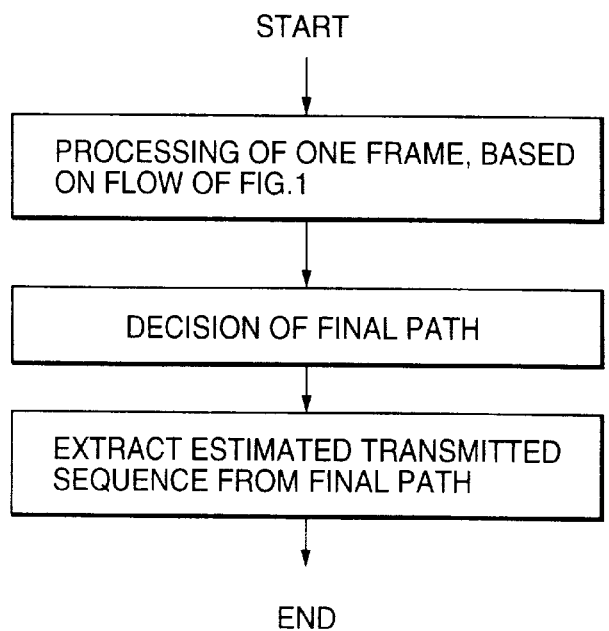
FIG. 7 is a flowchart illustrating a procedure for processing of estimations of a transmitted sequence.

The flow of such processing for estimating a transmitted sequence is shown in FIG. 7.

The receiver can estimate a sequence transmitted by the sender by performing the processing described thus far.

Figure 8:
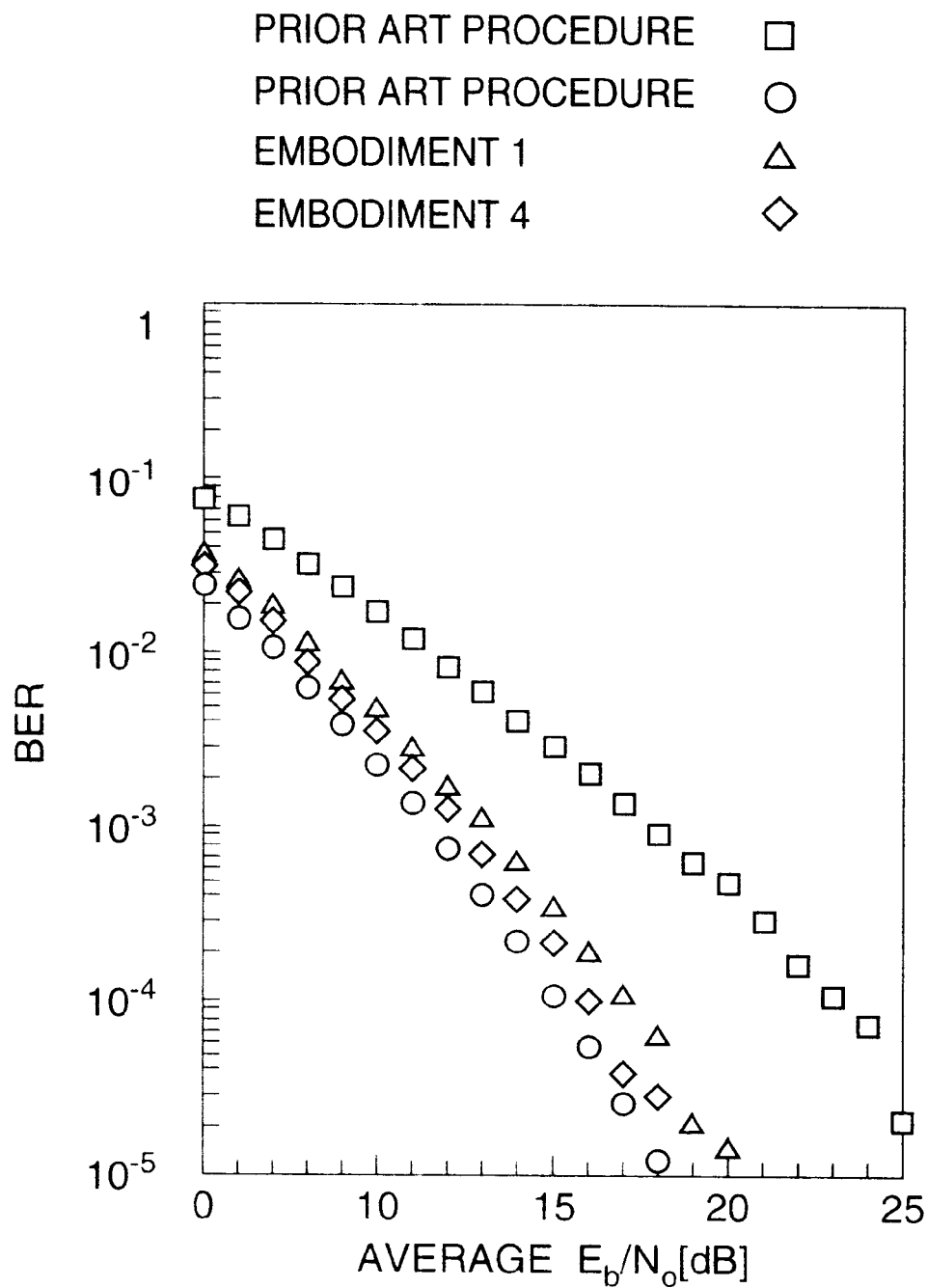
FIG. 8 illustrates results of simulations depicting the performance of a sequence estimation method according to Embodiment 1 and the performance of the prior art sequence estimation method.

The results of simulations performed where the processing according to this embodiment is adopted are shown in FIG. 8.

In FIG. 8, Δ indicates the bit error rate where a transmitted sequence is estimated by the processing according to this embodiment. Indicated by □ is the bit error rate where a transmitted sequence is estimated by the prior art DFSE. Indicated by ○ is the bit error rate where a transmitted sequence is estimated by the prior art MLSE.

In FIG. 8, the vertical axis is the bit error rate. The horizontal axis is the average $E_b/N_o$ ratio, which is the ratio of the average value of signal energy per bit to the noise power density.

Figure 12:
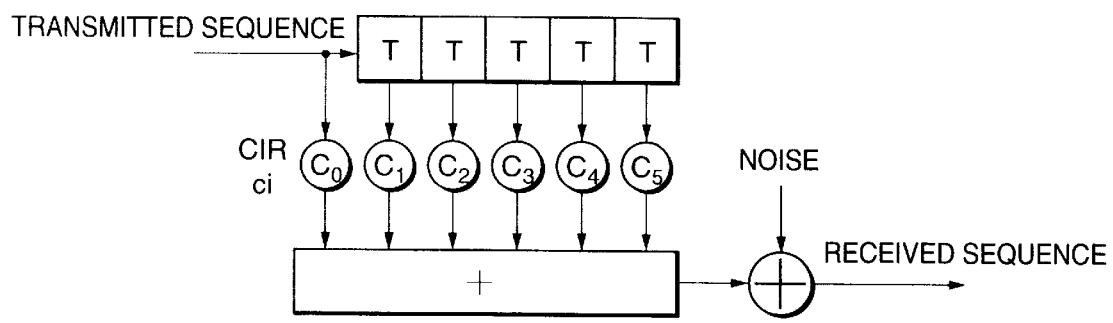
FIG. 12 is a diagram illustrating a model of a 6-tap channel.

This simulation is based on a channel model similar to that of FIG. 12, and is obtained under fading channel conditions where the electric powers of tap coefficients are identical and exhibit a Rayleigh distribution. In the prior art DFSE, the number of states in the memory L is set to 4. In the prior art MLSE, the number of states is set to 32. In this embodiment, the number of states is set to 4.

As can be seen from the results of this simulation shown in FIG. 8, the bit error rate can be made much smaller than that of the prior art DFSE by performing the processing according to this embodiment.

The amount of calculation is now discussed. It is assumed that the amount of calculation in the prior art DFSE is 1. The amount of calculation in the prior art MLSE is 8. The amount of calculation in this embodiment is 2. The amount of calculation can be made much smaller than that in the prior art MLSE.

As can be seen from the description provided thus far, the processing according to this embodiment can reduce the amount of calculation and estimate a transmitted sequence more precisely. The precise estimation of the transmitted sequence is permitted by the fact that the path metrics of modified paths are calculated, as well as the path metrics of surviving paths, compared, and modified. If paths are selected erroneously at past instants, they can be amended to correct ones by performing the processing for the amendment. Hence, reliable estimations can be made.

In this embodiment, a channel model where the tap coefficient $c_5$ is an influential factor is adopted. The invention can also be applied to other channel models. In this embodiment, a channel model where the tap coefficient $c_5$ is an influential factor is adopted and so values corresponding to the tap coefficient $c_5$ in the transmitted sequence are modified. Where the other tap coefficients are influential, it is necessary to change the modified positions according to the influential tap coefficients.

It is to be noted that the channel referred to herein embraces both wire channels and wireless channels.

In this embodiment, a transmitted sequence is extracted after processing of one frame. That is, "trace back" form is described. A memory exchange method is also available as other processing for estimating a transmitted sequence. It is possible to estimate a transmitted sequence by the method of "memory exchange". The processing for sequence estimations may be performed by other methods. This principle also applies to embodiments described below.

The estimating step in the claims includes these "trace back" method and "memory exchange" method.

Embodiment 2

This embodiment gives a sequence estimator for executing processing of the previous embodiment.

Figure 9:
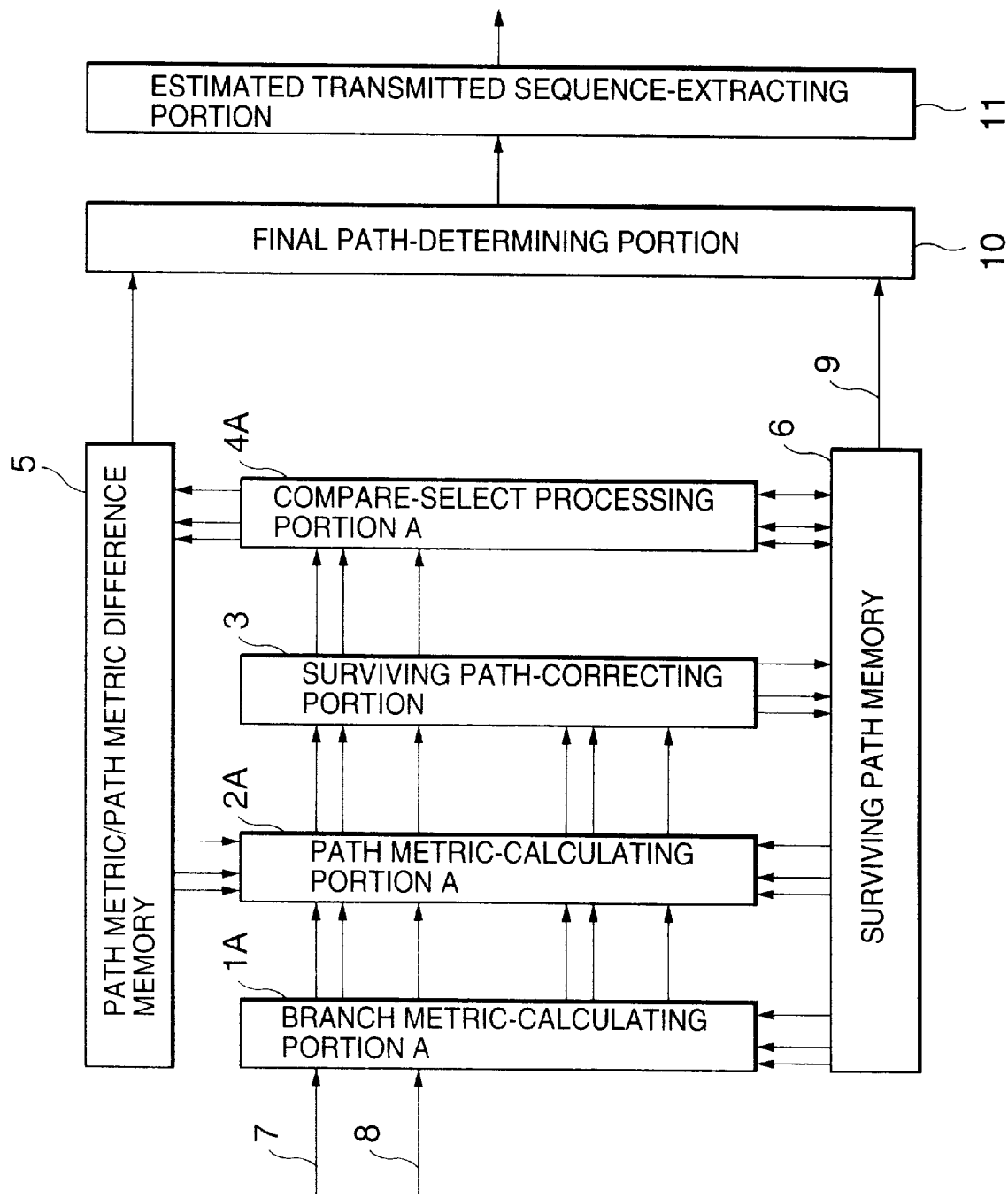
FIG. 9 is a block diagram of a sequence estimator according to Embodiment 2.

FIG. 9 is a block diagram of the sequence estimator for executing the processing of the previous embodiment.

In the FIG., 1A is a branch metric-calculating portion. Indicated by 2A is a path metric-calculating portion mounted on the output side of the branch metric-calculating portion 1A. Indicated by 3 is a surviving path-correcting portion mounted on the output side of the path metric-calculating portion 2A. Indicated by 4A is a comparison-and-selection-processing portion mounted on the output side of the surviving path-correcting portion 3. Indicated by 5 is a memory mounted on the output side of the comparison-and-selection-processing portion 4A and on the input side of the path metric-calculating portion 2A. This memory 5 acts as a memory for storing path metrics and also as a memory for storing metric differences. In the figure, the memory 5 is expressed as a path metric memory/metric difference memory.

Indicated by 6 is a surviving path memory connected with all of the branch metric-calculating portion 1A, the path metric-calculating portion 2A, the surviving path-correcting portion 3, and the comparison-and-selection-processing portion 4A.

Indicated by 7 is a received signal input terminal through which a received signal is entered. Indicated by 8 is a channel characteristic input terminal from which the characteristics of the channel (e.g., the tap coefficients described in the above-described embodiment) are entered. An output line 9 is used to deliver surviving paths stored in the surviving path memory 6.

Indicated by 10 is a final path-determining portion mounted on the output side of the path metric memory/metric difference memory 5 and of the surviving path memory 6. Indicated by 11 is an estimated transmitted sequence-extracting portion mounted on the output side of the final path-determining portion 10.

The operation of this sequence estimator is next described, corresponding to the contents of the processing of FIG. 1. The branch metric-calculating portion 1A performs BMG-I and BMG-II shown in FIG. 1. At this time, the values of what portions of the transmitted sequence are determined according to the characteristics of the channel entered from the channel characteristic input terminal 8. For example, where the channel has an influential tap coefficient $c_5$ as in Embodiment 1, a value corresponding to the tap coefficient $c_5$ of the transmitted sequence is modified.

The path metric-calculating portion 2A enters a branch metric calculated by the branch metric-calculating portion 1A and performs ADD-I and ADD-II illustrated in FIG. 1. The path metric-calculating portion 2A reads metric differences from the path metric memory/path metric difference memory 5 and surviving paths from the surviving path memory 6 during calculations of the path metrics of modified paths in ADD-I and ADD-II and calculates the path metrics of the modified paths.

The surviving path-correcting portion 3 enters the path metrics of normal paths calculated by the path metric-calculating portion 2A and the path metrics of the modified paths and performs COR-I, COR-II, COR-III, and COR-IV illustrated in FIG. 1. If paths are amended, the surviving path-correcting portion 3 stores the amended path in the surviving path memory 6.

The comparison-and-selection-processing portion 4A enters plural path metrics selected by the surviving path-correcting portion 3 and performs COM-I, COM-II, and SEL. During processing of COM-II, the comparison-and-selection-processing portion 4A stores metric differences in the path metric memory/path metric difference memory 5. During the processing of COM-II, the comparison-and-selection-processing portion 4A stores obtained surviving paths in the surviving path memory 6. Also, the path metrics of the surviving paths are stored in the path metric memory/path metric difference memory 5.

The processing portions described thus far performs the processing illustrated in FIG. 1 at each instant until one frame ends.

After the end of the processing of one frame, the final path-determining portion 10 enters the path metrics of the surviving paths obtained at the final instant for each of the states from the path metric memory/path metric difference memory 5, and enters surviving paths obtained for each of the states from the surviving path memory 6.

The final path-determining portion 10 selects a path having the least path metric from the input surviving paths as a final path. The estimated transmitted sequence-extracting portion 11 extracts a transmitted sequence from the final path determined by the final path-determining portion 10, and estimates the obtained transmitted sequence as a sequence transmitted by the sender.

The sequence estimator in accordance with this embodiment performs the processing described thus far and thus can estimate a transmitted sequence more precisely with a decreased amount of calculation. This precise estimation of the transmitted sequence is allowed by the fact that the path metrics of modified paths are calculated as well as the path metrics of surviving paths and that the paths are modified according to the results of the calculations of the path metrics. Even if erroneous paths were selected at past instants, they can be corrected by performing this processing for correction of paths. In consequence, estimations can be made with high reliability.

In this embodiment, the final path-determining portion 10 and the estimated transmitted sequence-extracting portion 11 are shown as a circuit configuration for forming processing for estimation of the transmitted sequence. A method of extracting an estimated transmitted sequence after processing of one frame by this configuration is referred to as "trace back" form. A "memory exchange method" is also available as other processing for estimating a transmitted sequence. A transmitted sequence can be estimated by this "memory exchange" method, in which case the circuit configuration is different in parts from the present embodiment.

The estimating step in the claims includes these "trace back" method and "memory exchange" method.

Embodiment 3

In the previous embodiment, modified paths are created while taking notice of one tap. Where plural influential taps exist, however, modified paths may be created while taking notice of the plural taps.

In this case, it follows that more modified paths are created, increasing the amount of processing. However, more accurate estimations can be made.

Embodiment 4

In the previous embodiment, the processing shown in FIG. 1 is performed once at each instant until one frame is completed.

However, the processing shown in FIG. 1 may be repeated, using surviving paths obtained by the first processing.

In the corrective processing shown in FIG. 1, paths going to various states at k=1 are corrected at instant k=4, for example. Therefore, at instant k=1, calculations of branch metrics or path metrics are not performed according to the corrected paths.

Accordingly, the processing BMG-I to SEL shown in FIG. 1 is repeatedly performed to carry out the processing according to the corrected paths. In consequence, more accurate estimations can be made.

Figure 10:
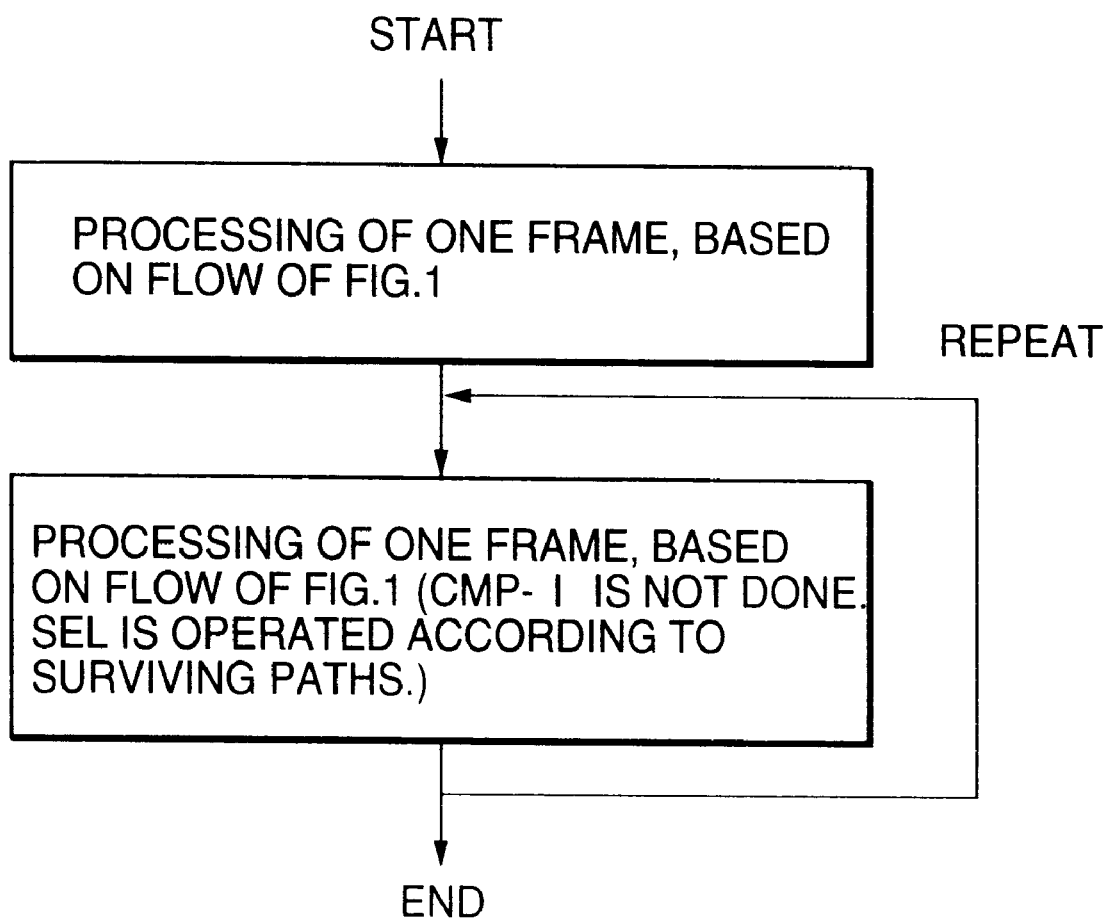
FIG. 10 is a flowchart illustrating a procedure for a sequence estimation method according to Embodiment 3.

That is, the processing is performed by the procedure illustrated in FIG. 10. CMP-I is not performed where repeated processing is performed.

Figure 11:
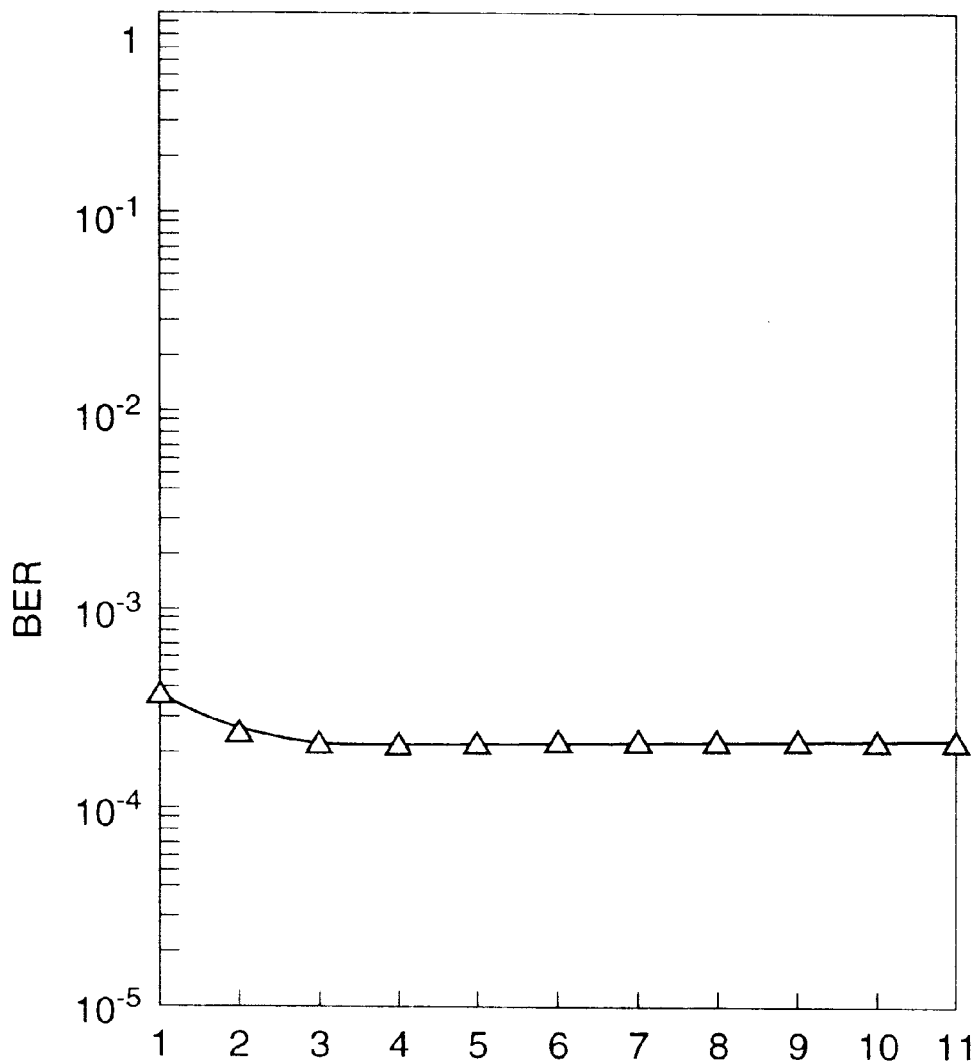
FIG. 11 illustrates the results of simulations depicting the relation of the number of repetitions to the bit error rate.

Although the number of repetitions may be set at will, if repetition is performed several times as shown in FIG. 11, the bit error rate converges. Accordingly, the optimum repetition number should be determined according to this characteristic.

The results of simulations performed where the processing according to this embodiment are shown in FIG. 8, where ◊ indicates the results of simulations in which the processing shown in FIG. 1 is repeated using surviving paths determined by the first processing as shown in FIG. 10. In these simulations, the number of repetitions is set to three.

It can be seen that the bit error rate is improved by performing repeated processing. In consequence, more accurate estimations can be made.

Embodiment 5

In the previous embodiment, a channel model having neither tap coefficient $c_3$ nor $c_4$ has been described. The invention can also be applied to a channel model having tap coefficients $c_3$ and $c_4$.

Where plural tap coefficients exist other than tap coefficients $c_0$–$c_2$, if corrective paths or corrected paths are created as follows, the amount of processing can be reduced.

The corrective paths or corrected paths are created to change the values of signals stored in memory that correspond to the most influential tap coefficient of the tap coefficients other than $c_0$–$C_2$.

For example, where the tap coefficient $c_3$ is most influential of the tap coefficients, corrective paths or corrected paths are created to vary signal values stored in memory that correspond to the tap coefficient $c_3$.

The most influential tap coefficient is a tap coefficient having the greatest value.

Embodiment 6

In the sequence estimator described thus far, the tap coefficients are fixed. The tap coefficient values and the number of tap coefficients may be modified according to the channel characteristics entered from the channel characteristic input terminal 8.

The provision of tap coefficient-modifying step or means for modifying tap coefficient values and the number of tap coefficients permits estimation of signal transmitted over any channel. Furthermore, where the channel characteristics are changed, the sequence estimator can cope with the characteristics.

Since the invention is constructed in this way, the following effects are produced.

A method of estimating a sequence in accordance with the present invention uses the Viterbi algorithm to select surviving paths from paths indicating transitions of states of combinations of data at a first instant up to a second instant. The surviving paths correspond to states of combinations of plural data items at the second instant. A signal sequence transmitted by a sender is estimated from a received signal and from the characteristics of a channel. This method comprises the steps of: calculating path metrics of paths going from states at the first instant to states at the second instant; deriving modified paths that are modifications of the paths going from the states at the first instant to the states at the second instant; calculating the path metrics of the modified paths derived by the modified path-deriving step; correcting the paths going from the states at the first instant to the states at the second instant according to results of the calculations performed by the first path metric-calculating step and the second path metric-calculating steps; determining a surviving path going to the states at the second instant from the plural paths going from the states at the first instant to the states at the second instant through the corrected paths; performing the first path metric-calculating step, the modified path-deriving step, the second path metric-calculating step, and the path-correcting step for each of the states of combinations of the plural data items at the second instant; then selecting a final path from surviving paths determined for each of the combinations of the data items at the second instant according to path metrics of the surviving paths; and estimating a signal sequence obtained from the final path selected by the final path-selecting step as a transmitted signal sequence. Consequently, a transmitted sequence can be estimated more precisely with a decreased amount of calculation.

The above-described step for introducing modified paths modifies parts of paths going from the states at the first instant to the states at the second instant according to the characteristics of the channel. The modified paths are changed according to the channel characteristics. A transmitted sequence can be estimated more accurately according to an actual channel.

In addition, the above-described step for introducing modified paths modifies branches occurring at a certain instant earlier than the second instant of those branches going from the states at the first instant to the states at the second instant. The transmitted sequence can be estimated more accurately by making modifications while taking account of branches at the certain past instant.

The certain instant described above is determined according to the degree of influence on the received signal. Therefore, branches having greater influences on the received signal can be modified by making modifications together with the degree of influence on the received signal. Hence, the transmitted signal can be estimated more accurately and more efficiently.

Moreover, the above-described step for deriving modified paths modifies plural branches of those branches which go from the states at the first instant to the states at the second instant. Therefore, plural branches can be corrected. In consequence, a transmitted signal can be estimated more accurately.

The above-described step for determining surviving paths determines surviving paths going to the states at the second instant according to the path metrics of plural paths going from the states at the first instant to the states at the second instants through the paths modified by the path-modifying step. Therefore, a transmitted sequence can be estimated more appropriately, using path metrics as a reference for evaluation.

A step is also included to take the differences between the path metrics of plural paths going from the states at the first instant to the states at the second instant through the paths modified by the path-modifying step. The second path metric-calculating step calculates the path metrics of the modified paths from the path metrics previously calculated by the path metric difference-calculating step and from the path metrics of the paths going from the states at the first instant to the states at the second instant, the path metrics being calculated by the first path metric-calculating step. Therefore, the path metrics of modified paths can be easily calculated.

The first path metric-calculating step, the modified path-deriving step, the second path metric-calculating step, the path-modifying step, and the surviving path-determining step are executed repeatedly according to results of the determination made by the surviving-determining step. The final path-selecting step selects a final path from surviving paths obtained by the repeated execution. The repeated processing improves the error rate. A transmitted sequence can be estimated more accurately.

A sequence estimator in accordance with the present invention lies in a sequence estimator for estimating the sequence of a signal transmitted from a sender according to a received signal and the characteristics of a channel by making use of the Viterbi algorithm for selecting surviving paths from paths indicating transitions of states of combinations of data at a first instant up to a second instant, the surviving paths respectively corresponding to the states of combinations of data at the second instant. This sequence estimator comprises: a path metric-calculating means for calculating path metrics of modifications of paths going from the states at the first instant to the states at the second instant, as well as the path metrics of paths going from the states at the first instant to the states at the second instant; a path-modifying means for modifying the paths going from the states at the first instant to the states at the second instant according to the results of calculations performed by the path metric-calculating means; a surviving path-determining means for determining surviving paths going to the states at the second instant from paths going from the states at the first instant to the states at the second instant through the paths modified by the path-modifying means; a final path-selecting means for selecting a final path from surviving paths determined about combinations of data items at the second instant by the surviving path-determining means according to the path metrics of the surviving paths; and an estimating means for estimating a signal sequence obtained from the final path selected by the final path-selecting means as the sequence of the transmitted signal.

Industrial Applicability

As described thus far, the present invention is adapted for a sender that estimates a transmitted signal sequence according to a received signal and the characteristics of a channel during transmission of digital data typified by cellular telephone. It is possible to estimate the transmitted sequence more precisely with a decreased amount of calculation.

What is claimed is:

1. A method of estimating a sequence transmitted by a sender by using a Viterbi algorithm to select surviving paths from paths indicating transitions of states of combinations of data at a first instant up to a second instant and by estimating the sequence from a received signal and from characteristics of a channel, said method comprising the steps of:

calculating path metrics of paths going from states at the first instant to states at the second instant;

deriving modified paths that are modifications of the paths going from the states at the first instant to the states at the second instant;

calculating the path metrics of the modified paths derived by the modified path-deriving step;

correcting the paths going from the states at the first instant to the states at the second instant according to results of the calculations performed by the first and second path metric-calculating steps;

determining a surviving path going to the states at the second instant from the plural paths going from the states at the first instant to the states at the second instant through paths corrected by the path-correcting step;

performing the first path metric-calculating step, the modified path-deriving step, the second path metric-calculating step, the path-correcting step, and the surviving path-determining step for each of the states of combinations of the plural data items at the second instant;

then selecting a final path from surviving paths determined for each of the combinations of the data items at the second instant according to path metrics of the surviving paths; and estimating a signal sequence obtained from the final path selected by the final path-selecting step as the transmitted signal sequence.

2. A method of estimating a sequence as set forth in claim 1, wherein said step for deriving modified paths modifies parts of paths going from the states at the first instant to the states at the second instant according to the characteristics of the channel.

3. A method of estimating a sequence as set forth in claim 1, wherein said step for deriving modified paths modifies branches occurring at a certain instant earlier than the second instant of those branches going from the states at the first instant to the states at the second instant.

4. A method of estimating a sequence as set forth in claim 3, wherein said certain instant is determined according to the degree of influence on the received signal.

5. A method of estimating a sequence as set forth in claim 1, wherein said step for deriving modified paths modifies plural branches of those branches which go from the states at the first instant to the states at the second instant.

6. A method of estimating a sequence as set forth in claim 1, wherein said step for determining surviving paths determines surviving paths going to the states at the second instant according to the path metrics of plural paths going from the states at the first instant to the states at the second instants through the paths modified by the path-modifying step.

7. A method of estimating a sequence as set forth in claim 6, further comprising the step of taking differences between the path metrics of plural paths going from the states at the first instant to the states at the second instant through the paths modified by the path-modifying step, and wherein said second path metric-calculating step calculates the path metrics of the modified paths from the path metrics previously calculated by the path metric difference-calculating step and from the path metrics of the paths going from the states at the first instant to the states at the second instant, the path metrics being calculated by the first path metric-calculating step.

8. A method of estimating a sequence as set forth in claim 1, wherein said first path metric-calculating step, said modified path-deriving step, said second path metric-calculating step, said path-modifying step, and said surviving path-determining step are executed repeatedly according to results of the determination made by said surviving path-determining step, and wherein said final path-selecting step selects a final step from surviving paths obtained by the repeated execution.

9. A sequence estimator for estimating the sequence of a signal transmitted from a sender according to a received signal and characteristics of a channel by making use of a Viterbi algorithm for selecting surviving paths from paths indicating transitions of states of combinations of data at a first instant up to a second instant, the surviving paths respectively corresponding to the states of combinations of data at the second instant, said sequence estimator comprising:

a path metric-calculating means for calculating path metrics of modifications of paths going from the states at the first instant to the states at the second instant, as well as the path metrics of paths going from the states at the first instant to the states at the second instant;

a path-modifying means for modifying the paths going from the states at the first instant to the states at the second instant according to the results of calculations performed by the path metric-calculating means;

a surviving path-determining means for determining surviving paths going to the states at the second instant from paths going from the states at the first instant to the states at the second instant through the paths modified by the path-modifying means;

a final path-selecting means for selecting a final path from surviving paths determined about combinations of data items at the second instant by the surviving path-determining means according to the path metrics of the surviving paths; and an estimating means for estimating a signal sequence obtained from the final path selected by the final path-selecting means as the sequence of a transmitted signal.

* * * * *